(12) United States Patent
Kim et al.

(10) Patent No.: US 11,355,210 B2
(45) Date of Patent: Jun. 7, 2022

(54) MEMORY SYSTEM AND OPERATING METHOD THEREOF

(71) Applicant: SK hynix Inc., Gyeonggi-do (KR)

(72) Inventors: Do Hun Kim, Gyeonggi-do (KR); Kwang Sun Lee, Gyeonggi-do (KR); Ju Hyun Kim, Gyeonggi-do (KR); Jin Yeong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/167,513

(22) Filed: Feb. 4, 2021

(65) Prior Publication Data
US 2022/0068408 A1   Mar. 3, 2022

(30) Foreign Application Priority Data
Sep. 2, 2020   (KR) .......................... 10-2020-0111438

(51) Int. Cl.
*G11C 16/10*    (2006.01)
*G11C 16/34*    (2006.01)
*G11C 7/10*     (2006.01)
*G11C 16/26*    (2006.01)

(52) U.S. Cl.
CPC ........ *G11C 16/3459* (2013.01); *G11C 7/1057* (2013.01); *G11C 7/1084* (2013.01); *G11C 16/10* (2013.01); *G11C 16/26* (2013.01)

(58) Field of Classification Search
CPC . G11C 16/3459; G11C 7/1057; G11C 7/1084; G11C 16/10; G11C 16/26
See application file for complete search history.

(56) References Cited

U.S. PATENT DOCUMENTS

2020/0150896 A1 *   5/2020   Kim ...................... G06F 3/0656

FOREIGN PATENT DOCUMENTS

| KR | 10-2019-0004400 | 1/2019 |
|----|-----------------|--------|
| KR | 10-2019-0066466 | 6/2019 |
| KR | 10-2020-0054538 | 5/2020 |

* cited by examiner

*Primary Examiner* — Xiaochun L Chen
(74) *Attorney, Agent, or Firm* — IP & T Group LLP

(57) ABSTRACT

Embodiments of the present disclosure relate to a memory system and an operating method thereof. According to the embodiments of the present disclosure, the memory system may store target data to be programmed in a memory device in a first memory, selectively store the target data in a second memory, program the target data stored in the first memory into the memory device, and reprogram the target data stored in the first memory or the second memory into the memory device when the programming of the target data stored in the first memory into the memory device fails. The buffer circuit may input the target data input from the memory controller into the second memory or discard the target data.

20 Claims, 22 Drawing Sheets

$(BW\_1) >= (BW\_2)$

MEMORY SYSTEM AND OPERATING METHOD THEREOF

CROSS-REFERENCE TO RELATED APPLICATION

The present application claims priority under 35 U.S.C. § 119(a) to Korean Patent Application No. 10-2020-0111438, filed in the Korean Intellectual Property Office on Sep. 2, 2020, which is incorporated herein by reference in its entirety.

BACKGROUND

1. Technical Field

Embodiments generally relate to a memory system and an operating method thereof.

2. Related Art

A memory system, e.g., a storage device, stores data on the basis of a request from a host, such as a computer, a mobile terminal (for example, a smartphone or a tablet), or any of various other electronic devices. The memory system may be a type of device that stores data in a magnetic disk such as a hard disk drive (HDD), or a type of device that stores data in a nonvolatile memory such as a solid state drive (SSD), a universal flash storage device (UFS), or an embedded MMC (eMMC) device.

The memory system may further include a memory controller for controlling the memory device. The memory controller may receive a command from the host and, on the basis of the received command, may execute or control operations for reading, writing, or erasing data in a volatile memory or a nonvolatile memory included in the memory system. The memory controller may drive firmware for performing a logical operation for controlling such operations.

In recognition that the memory system on occasion may fail to properly write data to the memory device, the memory system may store the backup data in a separate memory to rewrite the data. Implementing this separate memory as a high-speed memory increases the speed at which the data is written, but also increases the cost of the memory system. On the other hand, implementing the data backup memory as a low-speed memory is less costly than the high-speed option, but overall performance of the data writing process decreases due to the slower speed of the memory.

SUMMARY

Embodiments of the disclosure may provide a memory system and an operating method thereof capable of optimizing the cost required to satisfy the data write performance required by the host.

In addition, embodiments of the present disclosure may provide a memory system and an operating method thereof capable of efficiently programming data into memory devices even in situations where the performance of the host increases rapidly in the future.

In one aspect, embodiments of the disclosure may provide a memory system comprising a memory device, and a memory controller for communicating with the memory device and controlling the memory device.

The memory controller may comprise a first memory, a second memory and a buffer circuit.

The memory controller may store target data, which is data to be programmed in the memory device, in the first memory.

The memory controller may selectively store the target data in the second memory.

The memory controller may program the target data stored in the first memory into the memory device.

The memory controller may, when the programming of the target data stored in the first memory into the memory device fails, reprogram the target data stored in the first memory or the second memory.

In this case, the first memory may operate at a higher speed than the second memory.

The memory controller may selectively store the target data in the second memory by providing the target data to the buffer circuit to input the target data into the second memory or discard the target data.

In another aspect, embodiments of the disclosure may provide an operating method of a memory system.

The operating method of the memory system may comprise storing target data to be programmed in a memory device in a first memory.

The operating method of the memory system may comprise selectively storing the target data in a second memory.

The operating method of the memory system may comprise programming the target data stored in the first memory into the memory device.

The operating method of the memory system may comprise reprogramming the target data stored in the first memory or the second memory into the memory device when the programming the target data stored in the first memory into the memory device fails.

In this case, the first memory may operate at a higher speed than the second memory.

The selectively storing of the target data in the second memory may comprise inputting the target data to a buffer circuit.

The selectively storing of the target data in the second memory may comprise inputting the target data in the buffer circuit into the second memory or discarding the target data.

In another aspect, embodiments of the disclosure may provide an operating method of a controller.

The operating method of the controller may store data in a first memory.

The operating method of the controller may store the data in a second memory via a buffer when the buffer has available space to buffer the data.

The operating method of the controller may remove the stored data from the second memory when the stored data is successfully programmed in a storage.

The operating method of the controller may remove the stored data from the first memory 1) when the data is not stored in the second memory and the stored data is successfully programmed in the storage or 2) when the data is stored in the second memory and the stored data is provided to the storage.

Each of the first memory and the buffer may have a higher operation speed than the second memory.

According to the embodiments of the disclosure, it is possible to optimize the cost required to satisfy the data write performance required by the host.

Furthermore, according to embodiments of the disclosure, it is possible to efficiently program data into memory devices even in situations where the performance of the host increases rapidly in the future.

DETAILED DESCRIPTION

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Figure 1:
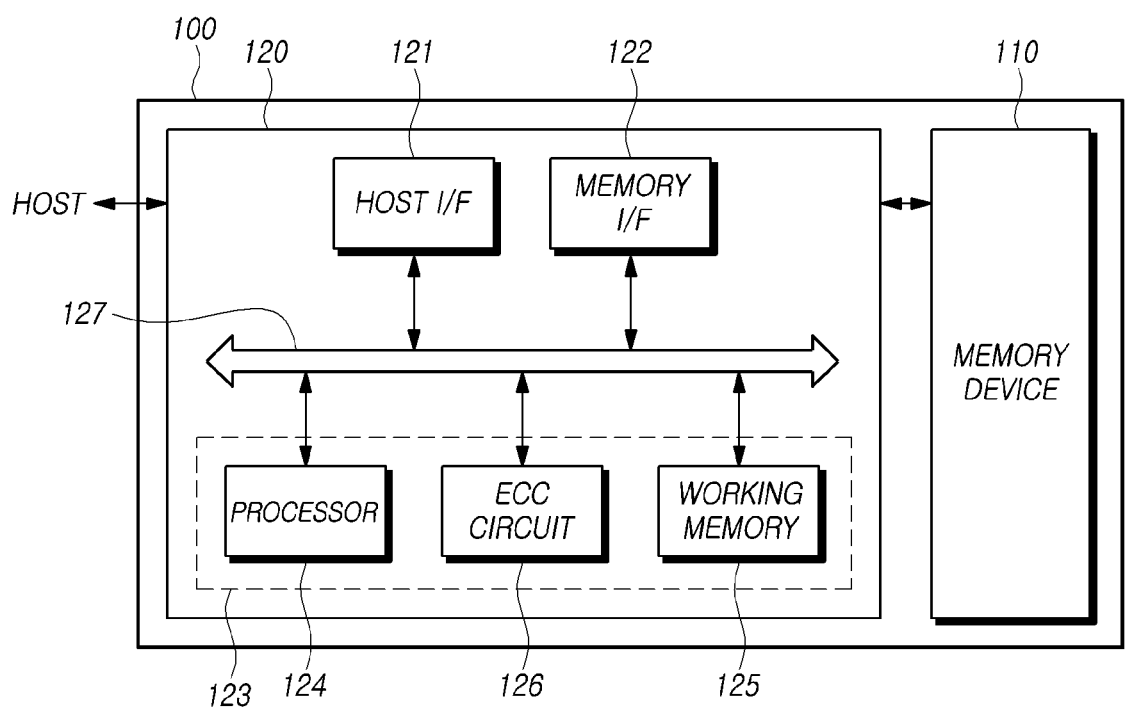
FIG. 1 is a schematic diagram illustrating a configuration of a memory system according to an embodiment of the present disclosure.

FIG. 1 is a diagram schematically illustrating a configuration of a memory system 100 according to an embodiment of the present disclosure.

Referring to FIG. 1, the memory system 100 may include a memory device 110 configured to store data, and a memory controller 120 configured to control the memory device 110.

The memory device 110 may include multiple memory blocks. The memory device 110 may be configured to operate in response to control signals received from the memory controller 120. Operations of the memory device 110 may include, for example, a read operation, a program operation (also referred to as a "write operation"), an erasure operation, and the like.

The memory device 110 may include a memory cell array including multiple memory cells (also simply referred to as "cells") configured to store data. The memory cell array may exist inside a memory block.

For example, the memory device 110 may be implemented as any of various types of memories, such as a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM), and/or a spin transfer torque random access memory (STT-RAM).

The memory device 110 may be implemented in a three-dimensional array structure. Embodiments of the present disclosure are applicable not only to a flash memory device having an electric charge storage layer configured as a conductive floating gate, but also to a flash memory device having a charge trap flash (CTF) having an electric charge storage layer configured as an insulating film.

The memory device 110 may be configured to receive a command and an address from the memory controller 120 and to access an area of the memory cell array selected using the address. That is, the memory device 110 may perform an operation corresponding to the received command in a memory area of the memory device having a physical address corresponding to the received address from the controller.

For example, the memory device 110 may perform a program operation, a read operation, an erase operation, and the like. During the program operation, the memory device 110 may program data in the area selected by the address. During the read operation, the memory device 110 may read data from the area selected by the address. During the erase operation, the memory device 110 may erase data stored in the area selected by the address.

The memory controller 120 may control write (or program), read, erase, and background operations with regard to the memory device 110. The background operation may be, for example, a garbage collection operation (GC), a wear leveling (WL) operation, and/or a bad block management (BBM) operation.

The memory controller 120 may control the operation of the memory device 110 at the request of a host. Alternatively, the memory controller 120 may control the operation of the memory device 110 without a corresponding request of the host, such as, for example, when it performs one or more background operations of the memory device.

The memory controller 120 and the host may be separate devices. In another embodiment, the memory controller 120 and the host may be integrated and implemented as a single device. In the following description, the memory controller 120 and the host are separate devices.

The memory controller 120 may include a host interface (I/F) 121, a memory interface 122, and a control circuit 123.

The host interface 121 may be configured to provide an interface for communication with the host.

When receiving a command from the host (HOST), the control circuit 123 may receive the command through the host interface 121 and may perform an operation of processing the received command.

The memory interface 122 may be connected to the memory device 110 to provide an interface for communication with the memory device 110. That is, the memory interface 122 may be configured to provide the memory device 110 and the memory controller 120 with an interface in response to control of the control circuit 123.

The control circuit 123 may be configured to control the operation of the memory device 110 by performing operations for overall control of the memory controller 120. For example, the control circuit 123 may include a processor 124 and a working memory 125. The control circuit 123 may further include an error detection and correction (detection/correction) circuit (i.e., ECC circuit) 126.

The processor 124 may control overall operation of the memory controller 120. The processor 124 may perform a logical operation. The processor 124 may communicate with the host through the host interface 121. The processor 124 may communicate with the memory device 110 through the memory interface 122.

The processor 124 may perform a function of a flash translation layer (FTL). The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, according to the mapping unit. Typical address mapping methods include a page mapping method, a block mapping method, and a hybrid mapping method.

The processor 124 may be configured to randomize data received from the host. For example, the processor 124 may randomize data received from the host by using a randomizing seed. The randomized data is provided to the memory device 110 as data to be stored, and is programmed in the memory cell array.

The processor 124 may be configured to derandomize data received from the memory device 110 during a read operation. For example, the processor 124 may derandomize data received from the memory device 110 by using a derandomizing seed. The derandomized data may be output to the host.

The processor 124 may execute firmware (FW) to control the operation of the memory controller 120. In other words, the processor 124 may control overall operation of the memory controller 120 and, in order to perform a logical operation, may execute (or drive) firmware loaded into the working memory 125 during booting.

The firmware refers to a program executed inside the memory system 100, and may include various functional layers.

For example, the firmware may include a flash translation layer (FTL), a host interface layer (HIL) and/or a flash interface layer (FIL). The flash translation layer is configured to translate between a logical address that the host requests the memory system 100 to provide and a physical address of the memory device 110. The host interface layer is configured to interpret a command that the host issues to the memory system 100 (or storage device) and to deliver the same to the FTL. The flash interface layer is configured to deliver a command issued by the FTL to the memory device 110.

For example, the firmware may be stored in the memory device 110, then loaded into the working memory 125.

The working memory 125 may store firmware, program codes, commands, or pieces of data to drive the memory controller 120. The working memory 125 may include, for example, a static RAM (SRAM), a dynamic RAM (DRAM), and/or a synchronous RAM (SDRAM) as a volatile memory.

The error detection/correction circuit 126 may be configured to detect error bit(s) of target data by using an error correction code, and to correct the detected error bit(s). For example, the target data may be data stored in the working memory 125, data retrieved from the memory device 110, or the like.

The error detection/correction circuit 126 may be implemented to decode data by using the error correction code. The error detection/correction circuit 126 may be implemented by using various code decoders. For example, a decoder that performs nonsystematic code decoding or a decoder that performs systematic code decoding may be used.

For example, the error detection/correction circuit 126 may detect error bit(s), sector by sector, with regard to each piece of read data. That is, each piece of read data may include multiple sectors. As used herein, a sector may refer to a data unit smaller than the read unit (e.g., page) of a flash memory. Sectors constituting each piece of read data may correspond to each other via an address.

The error detection/correction circuit 126 may calculate a bit error rate (BER) and determine whether or not correction can be made sector by sector. For example, if the BER is higher than a reference value, the error detection/correction circuit 126 may determine that the corresponding sector is uncorrectable or "a fail". If the BER is lower than the reference value, the error detection/correction circuit 126 may determine that the corresponding sector is correctable or "a pass".

The error detection/correction circuit 126 may perform error detection and correction operations successively with regard to all pieces of read data. When a sector in the read data is correctable, the error detection/correction circuit 126 may omit the error detection and correction operations related to the corresponding sector with regard to the next piece of read data. After finishing error detection and correction operations with regard to all pieces of read data in this manner, the error detection/correction circuit 126 may detect a sector deemed uncorrectable to the end. There may be one or more sectors deemed uncorrectable. The error detection/correction circuit 126 may deliver information (for example, address information) regarding the sectors deemed uncorrectable to the processor 124.

The bus 127 may be configured to provide a channel between the constituent elements 121, 122, 124, 125, and 126 of the memory controller 120. The bus 127 may include, for example, a control bus for delivering various types of control signals and commands, and a data bus for delivering various types of data.

The above-mentioned constituent elements 121, 122, 124, 125, and 126 of the memory controller 120 are only provided as examples. One or more of the above-mentioned constituent elements may be omitted from the memory controller 120, and/or one or more of the above-mentioned constituent elements may be integrated into a single element. In addition, in some cases, one or more other constituent elements may be added, in addition to the above-mentioned constituent elements of the memory controller 120.

Hereinafter, the memory device 110 is described in more detail with reference to FIG. 2.

Figure 2:
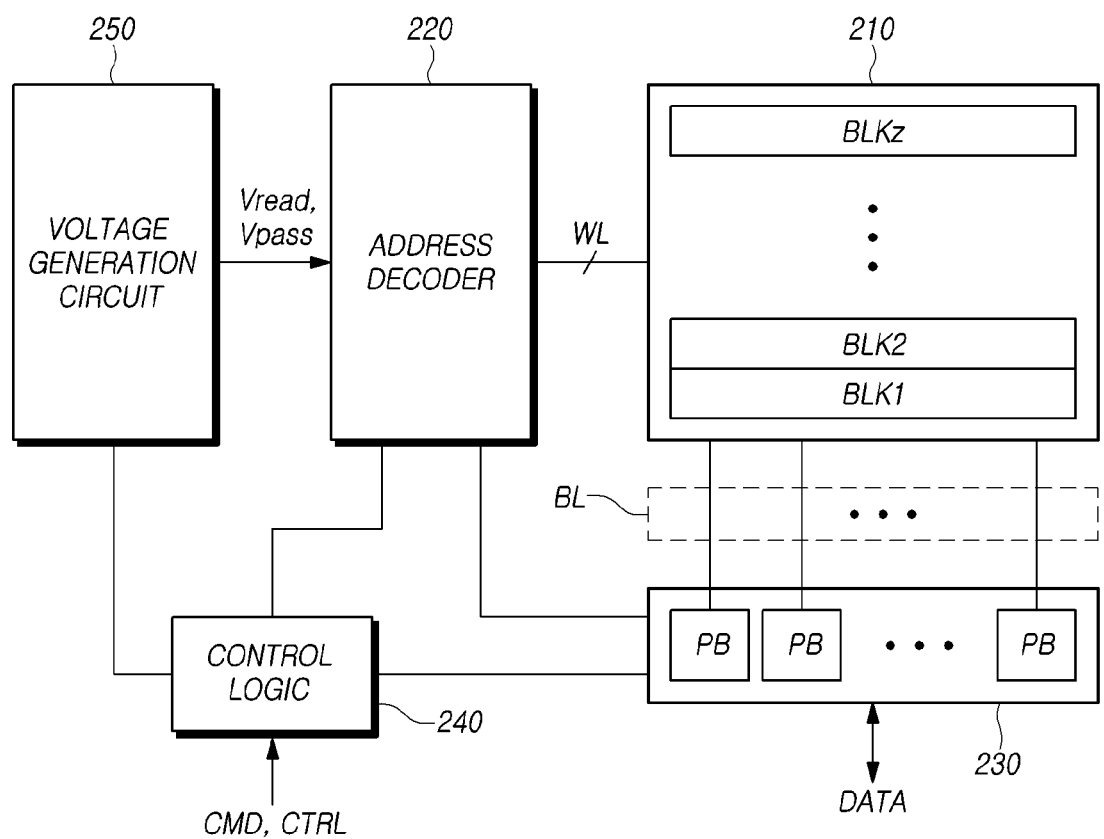
FIG. 2 is a block diagram schematically illustrating a memory device according to an embodiment of the present disclosure.

FIG. 2 is a block diagram schematically illustrating a memory device 110 according to an embodiment of the present disclosure.

Referring to FIG. 2, the memory device 110 may include a memory cell array 210, an address decoder 220, a read and write (read/write) circuit 230, control logic 240, and a voltage generation circuit 250.

The memory cell array 210 may include multiple memory blocks BLK1-BLKz, where z is a natural number greater than or equal to 2.

In the multiple memory blocks BLK1-BLKz, multiple word lines WL and multiple bit lines BL may be disposed, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells may be nonvolatile memory cells, which may have a vertical channel structure.

The memory cell array 210 may be configured as a memory cell array having a two-dimensional structure and, in some cases, may be configured as a memory cell array having a three-dimensional structure.

Each of the multiple memory cells in the memory cell array 210 may store at least one bit of data. For example, each of the multiple memory cells in the memory cell array 210 may be a single-level cell (SLC) configured to store one bit of data, a multi-level cell (MLC) configured to store two bits of data, a triple-level cell (TLC) configured to store three bits of data, or a quad-level cell (QLC) configured to store four bits of data. As another example, the memory cell array 210 may include multiple memory cells, each of which may be configured to store five or more bits of data.

The address decoder 220, the read/write circuit 230, the control logic 240, and the voltage generation circuit 250 may operate as a peripheral circuit configured to drive the memory cell array 210.

The address decoder 220 may be connected to the memory cell array 210 through the multiple word lines WL.

The address decoder 220 may be configured to operate in response to control of the control logic 240.

The address decoder 220 may receive addresses through an input/output buffer inside the memory device 110. The address decoder 220 may be configured to decode a block address among the received addresses. The address decoder 220 may select at least one memory block according to the decoded block address.

The address decoder 220 may receive a read voltage Vread and a pass voltage Vpass from the voltage generation circuit 250.

During a read operation, the address decoder 250 may apply the read voltage Vread to a selected word line WL inside a selected memory block, and may apply the pass voltage Vpass to the remaining non-selected word lines WL.

During a program verification operation, the address decoder 220 may apply a verification voltage generated by the voltage generation circuit 250 to a selected word line WL inside a selected memory block, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line according to the block address and the row address. The column address may be decoded by the address decoder 220 and provided to the read/write circuit 230.

The address decoder 220 may include a block decoder, a row decoder, a column decoder, and/or an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that is used in a data processing function and, in some cases, may further include a cache buffer used in a caching function.

The multiple page buffers PB may be connected to the memory cell array 210 through the multiple bit lines BL. In order to sense the threshold voltage Vth of the memory cells during a read operation and a program verification operation, the multiple page buffers PB may continuously supply a sensing current to the bit lines BL connected to the memory cells, may sense, through a sensing node, a change in the amount of current that flows according to the program state of a corresponding memory cell, and may latch the same as sensing data.

The read/write circuit 230 may operate in response to page buffer control signals output from the control logic 240.

During a read operation, the read/write circuit 230 senses data in a memory cell, temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control overall operation of the memory device 110 in response to the control signal CTRL. The control logic 240 may output a control signal for adjusting the pre-charge potential level of sensing nodes of multiple page buffers PB.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

A memory block BLK in the memory device 110 may consist of multiple pages PG and multiple strings. The multiple pages PG correspond to multiple word lines WL, and the multiple strings STR correspond to multiple bit lines BL.

In the memory block BLK, multiple word lines WL and multiple bit lines BL may be arranged to intersect. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

The multiple word lines WL and the multiple bit lines BL may intersect with each other, thereby defining multiple memory cells MC. Each memory cell MC may have a transistor TR arranged therein.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some cases, at least one dummy word line may be additionally arranged between the first outermost word line and the first selection line. In addition, at least one dummy word line may be additionally arranged between the second outermost word line and the second selection line.

A read operation and a program operation (i.e., write operation) of the memory block may be performed page by page, and an erase operation may be performed memory block by memory block.

Figure 3:
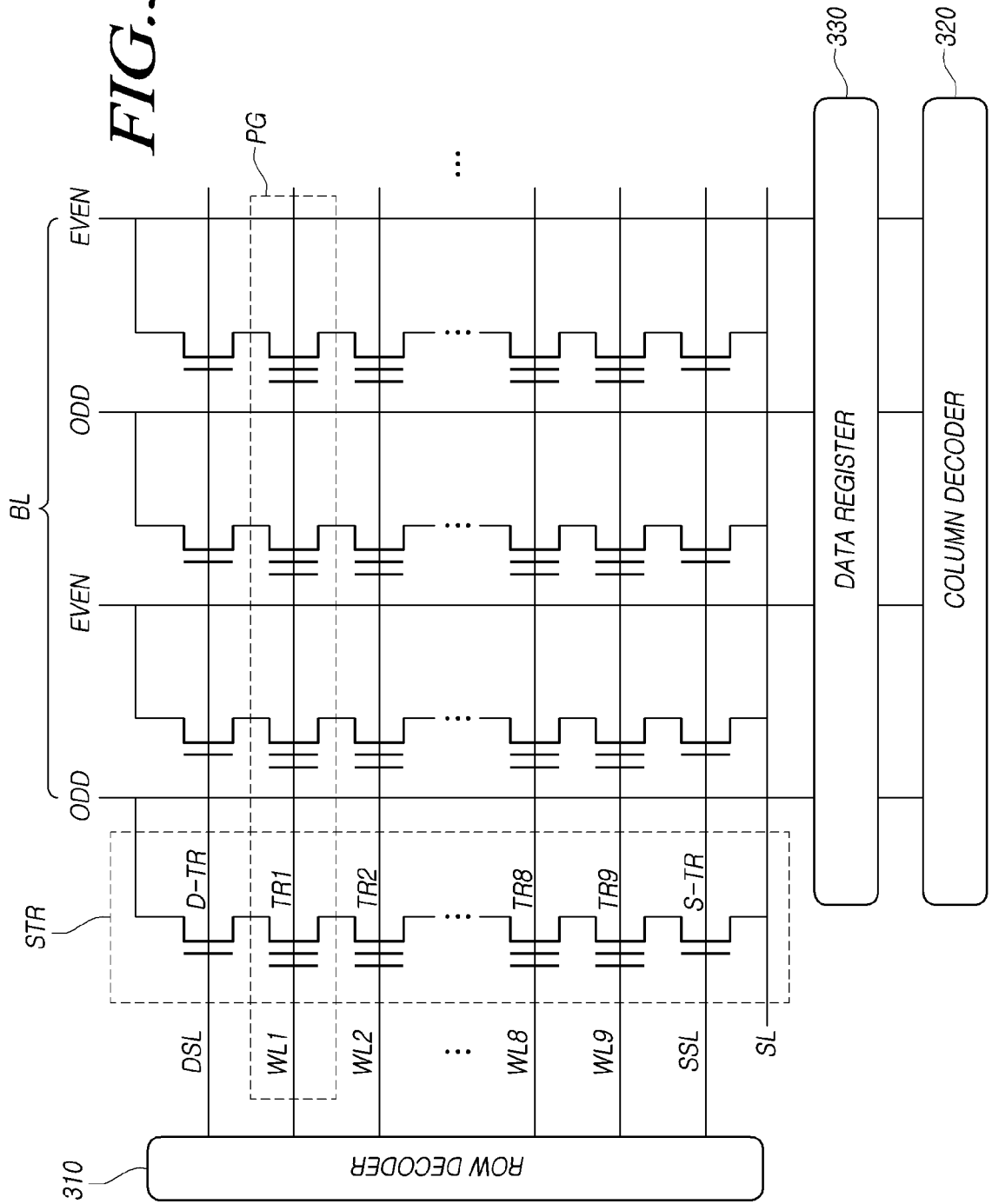
FIG. 3 is a diagram illustrating a structure of word lines and bit lines of a memory device according to an embodiment of the present disclosure.

FIG. 3 is a diagram illustrating a structure of word lines WL and bit lines BL of a memory device 110 according to an embodiment of the present disclosure.

Referring to FIG. 3, the memory device 110 has a core area in which memory cells MC are concentrated, and an auxiliary area which corresponds to the remaining non-core area. The auxiliary area supports the operations of the memory cell array 210.

The core area may include pages PG and strings STR. In the core area, multiple word lines WL1-WL9 and multiple bit lines BL are arranged to intersect.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (for example, two or four) pages PG. Each page PG is the smallest unit in connection with conducting a program operation and a read operation, and all memory cells MC within the same page PG may perform simultaneous operations when conducting a program operation and a read operation.

The multiple bit lines BL may be connected to the column decoder 320 while being distinguished between odd-numbered bit lines BL and even-numbered bit lines BL.

For accessing a memory cell MC, the address may be entered to the core area first through the input/output and then through the row decoder 310 and the column decoder 320 such that a corresponding target memory cell can be designated. As used herein, designating a target memory cell refers to accessing one of the memory cells MC at the sites of intersection between the word lines WL1-WL9 connected to the row decoder 310 and the bit lines BL connected to the column decoder 320, for programming data therein or for reading programmed data therefrom.

Pages PG in a first direction (for example, horizontal direction as seen in FIG. 3) are bound by a commonly used line referred to as a word line WL, and strings STR in a second direction (for example, vertical direction as seen in FIG. 3) are bound (i.e., connected) by a common line referred to as a bit line BL. As used herein, being commonly bound refers to being structurally connected by the same material and simultaneously receiving the same voltage during voltage application. The voltage applied to a memory cell MC further down the line among memory cells MC connected in series may slightly differ from the voltage applied to a memory cell MC further up line, due to the voltage drop across the preceding memory cell(s) MC.

The data register 330 plays an important role because all data processing by the memory device 110, including program and read operations, occurs via the data register 330. If data processing by the data register 330 is delayed, all of the other areas need to wait until the data register 330 finishes the data processing. In addition, degradation of performance of the data register 330 may degrade overall performance of the memory device 110.

In the example illustrated in FIG. 3, in one string STR, multiple transistors TR1-TR9 may be connected to multiple word lines WL1-WL9, respectively. The multiple transistors TR1-TR9 correspond to memory cells MC. In this example, each of the multiple transistors TR1-TR9 include a control gate CG and a floating gate FG.

The multiple word lines WL1-WL9 include two outermost word lines WL1 and WL9. A first selection line DSL may be additionally arranged outside the first outermost word line WL1, which is closer to the data register 330 in terms of the signal path among the two outermost word lines WL1 and WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR plays the role of a switch that turns on or off the connection between the corresponding string STR and the data register 330. The second selection transistor S-TR plays the role of a switch that turns on or off the connection between the corresponding string STR and the source line SL. That is, the first selection transistor D-TR and the second selection transistor S-TR play the role of gatekeepers which are positioned at opposite ends of the corresponding string STR to deliver or block signals.

During a program operation, the memory system 100 fills the target memory cell MC of the bit line BL which is to be programmed with electrons. Accordingly, the memory system 100 applies a turn-on voltage Vcc to the gate electrode of the first selection transistor D-TR, thereby turning on the first selection transistor D-TR, and applies a turn-off voltage (for example, 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may supply a voltage (for example, +20V) to the substrate through a source line SL during an erase operation. The memory system 100 floats both the first selection transistor D-TR and the second selection transistor S-TR during an erase operation, thereby generating an infinite resistance. As a result, the role of the first selection transistor D-TR and that of the second selection transistor S-TR may be removed, and electrons may operate only between the floating gate FG and the substrate due to the potential difference.

Figure 4:
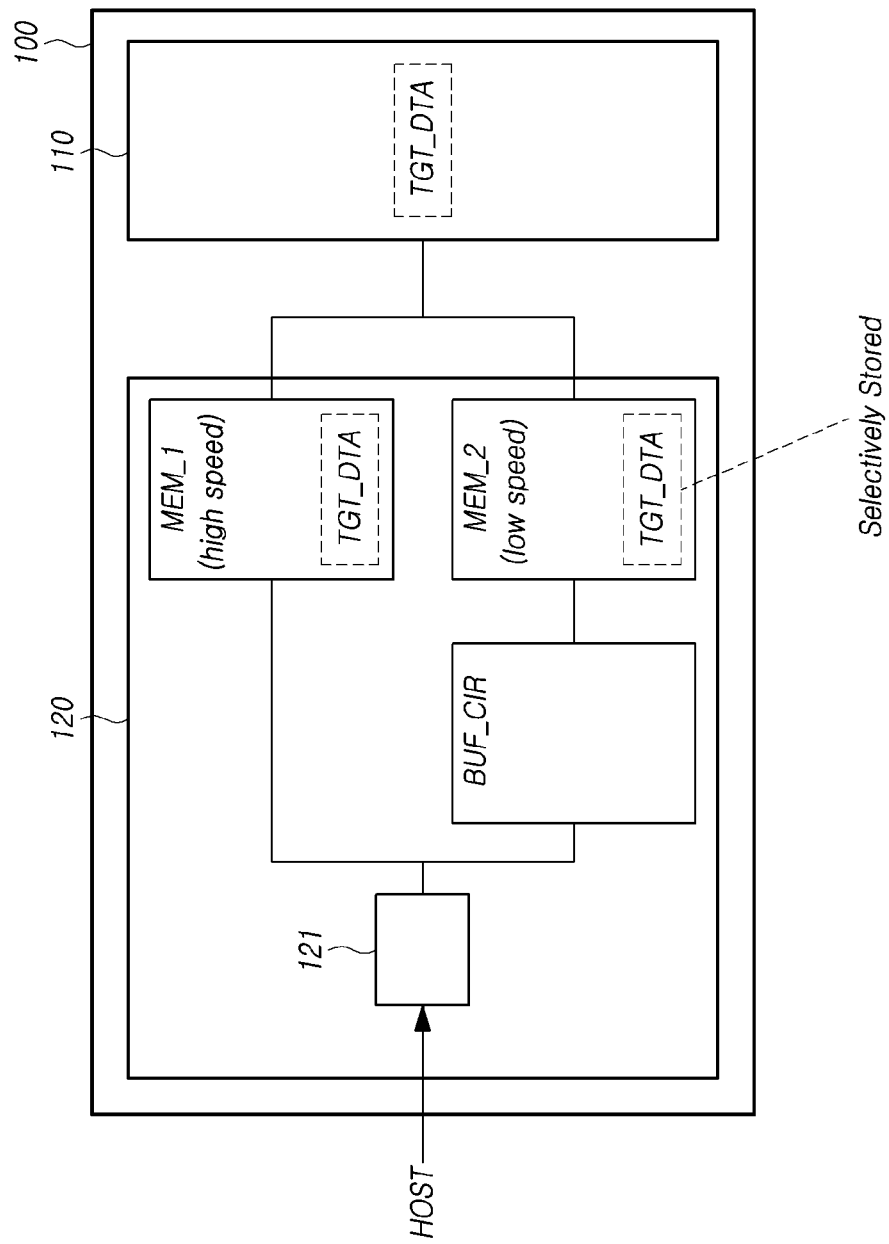
FIG. 4 is a schematic configuration diagram of the memory system according to an embodiment of the present disclosure.

FIG. 4 is a schematic diagram illustrating a configuration of the memory system 100 according to an embodiment of the present disclosure.

Referring to FIG. 4, the memory controller 120 of the memory system 100 may include a first memory MEM_1, a second memory MEM_2, and a buffer circuit BUF_CIR.

The memory controller 120 may store target data TGT_DTA to be programmed in the memory device 110 in at least one of the first memory MEM_1 and the second memory MEM_2. For example, the memory controller 120 may store the target data TGT_DTA in both the first memory MEM_1 and the second memory MEM_2. As another example, the memory controller 120 may store the target data TGT_DTA in only one of the first memory MEM_1 and the second memory MEM_2.

In an embodiment of the present disclosure, the memory controller 120 stores the target data TGT_DTA in the first memory MEM_1 but selectively stores the target data in the second memory MEM_2. That is, the target data TGT_DTA may be stored in the first memory MEM_1 irrespective of a specific condition, but may be stored in the second memory MEM_2 only when the specific condition is satisfied.

When the host requests the memory system 100 to write the target data TGT_DTA, the memory system 100 may store target data TGT_DTA received from the host through the host interface 121 in at least one of the first memory MEM_1 and the second memory MEM_2. More broadly, the host may represent any suitable entity or control source to which the memory system 100 is responsive.

For example, in order to store target data TGT_DTA already stored in the memory device 110 in a new location in the memory device 110 while performing a background operation (e.g., garbage collection, wear leveling, read reclaim, etc.), the memory controller 120 of the memory system 100 may read the target data TGT_DTA from the memory device 110 through the memory interface 122 and store such data in at least one of the first memory MEM_1 and the second memory MEM_2, each of which is capable of storing the target data TGT_DTA.

The two memories may operate at different speeds. For example, the first memory MEM_1 may operate at a higher speed than the second memory MEM_2. For example, the first memory MEM_1 may be an SRAM, and the second memory MEM_2 may be a DRAM. For the same storage capacity, the higher speed memory, which in the example above is MEM_1, costs more than the lower speed memory, e.g., MEM_2.

The target data TGT_DTA may be stored in the second memory MEM_2 via the buffer circuit BUF_CIR. That is, the target data TGT_DTA may be first temporarily stored in the buffer circuit BUF_CIR and then stored in the second memory MEM_2.

The buffer circuit BUF_CIR may receive target data TGT_DTA from the memory controller 120, and may input the received target data TGT_DTA to the second memory MEM_2 or may discard the received target data TGT_DTA. If the buffer circuit BUF_CIR discards the received target data TGT_DTA, the target data TGT_DTA may not be stored in the second memory MEM_2.

Discarding the received target data TGT_DTA by the buffer circuit BUF_CIR may mean that the target data TGT_DTA is not stored in, or not transferred to, the second memory MEM_2.

In addition, the memory controller 120 may program the target data TGT_DTA stored in the first memory MEM_1 or the second memory MEM_2 into the memory device 110.

If the operation of the memory controller 120 to program the target data TGT_DTA in the memory device 110 is successfully completed, the memory controller 120 may delete the target data TGT_DTA from whichever, or both, of MEM_1 and MEM_2 such data was stored.

On the other hand, if the operation of programming the target data TGT_DTA in the memory device 110 by the memory controller 120 fails, the memory controller 120 may reprogram the target data TGT_DTA into the memory device 110 by using the target data TGT_DTA stored in the first memory MEM_1 and/or the second memory MEM_2.

Hereinafter, a specific example in which the memory system 100 programs target data TGT_DTA stored in the first memory MEM_1 or the second memory MEM_2 into the memory device 110 is described.

Figure 5:
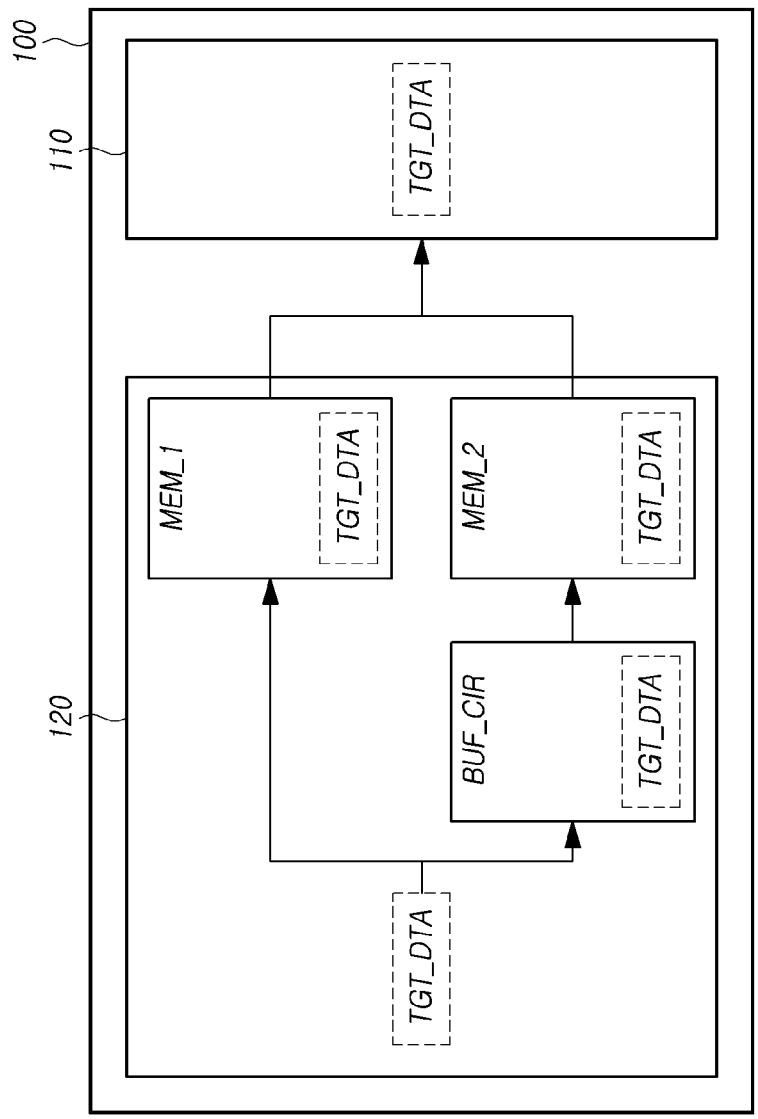
FIG. 5 is a diagram illustrating an example of an operation of programming target data in the memory device by the memory system according to an embodiment of the present disclosure.

FIG. 5 is a diagram illustrating an example of an operation of programming target data TGT_DTA in the memory device 110 by the memory system 100 according to an embodiment of the present disclosure.

For example, the target data TGT_DTA may be stored in both the first memory MEM_1 and the second memory MEM_2. In this case, the second memory MEM_2 may store the target data TGT_DTA input from the buffer circuit BUF_CIR.

The memory controller 120 of the memory system 100 may program the target data TGT_DTA stored in the first memory MEM_1 or the second memory MEM_2 into the memory device 110.

In this case, the memory controller 120 may program the target data TGT_DTA stored in the first memory MEM_1 in the memory device 110 with a higher priority than the target data TGT_DTA stored in the second memory MEM_2. That is, if the target data TGT_DTA is stored in both the first memory MEM_1 and the second memory MEM_2, the memory controller 120 may program the target data TGT_DTA stored in the first memory MEM_1 into the memory device 110, whereas, if the target data TGT_DTA is not stored in the first memory MEM_1 but is stored in the second memory MEM_2, the memory controller 120 may program the target data TGT_DTA stored in the second memory MEM_2 into the memory device 110.

Figure 6:
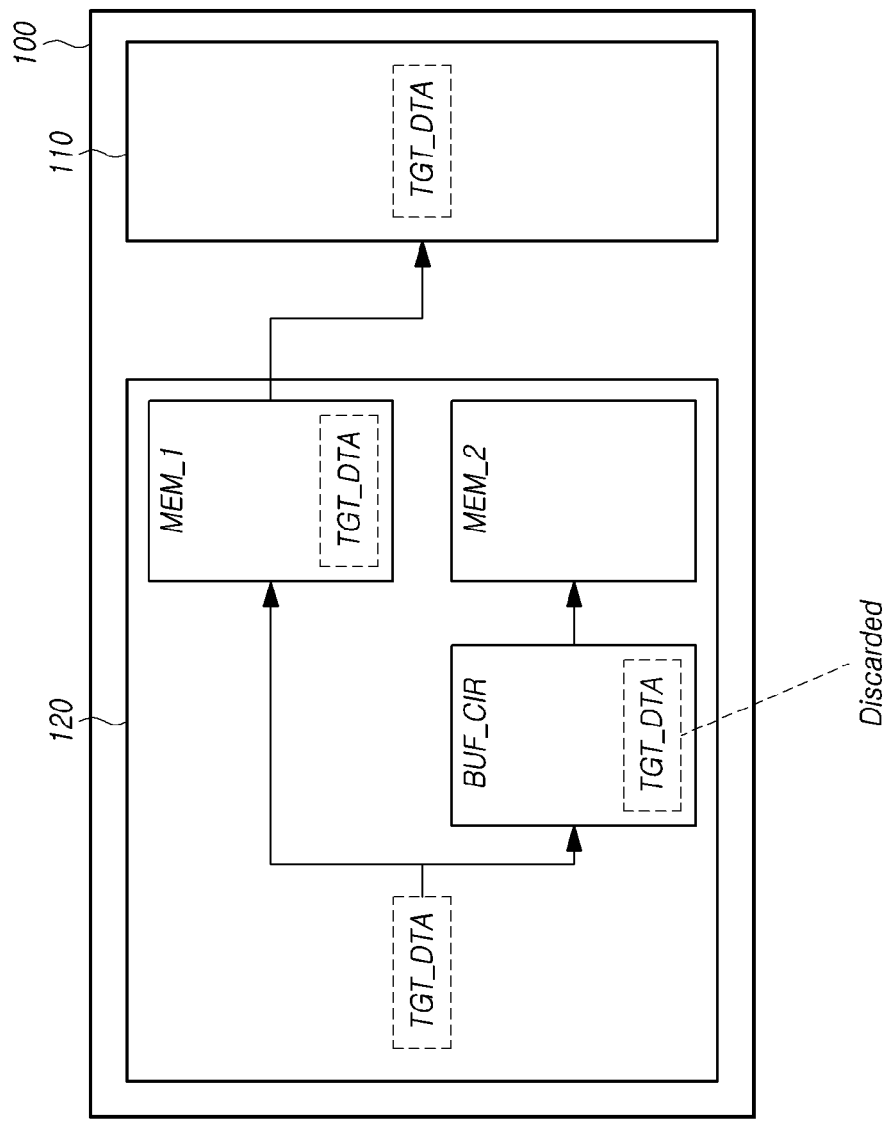
FIG. 6 is a diagram illustrating another example of an operation of programming target data into the memory device by the memory system according to an embodiment of the present disclosure.

FIG. 6 is a diagram illustrating another example of an operation of programming the target data TGT_DTA into the memory device 110 by the memory system 100 according to an embodiment of the present disclosure.

In FIG. 6, the buffer circuit BUF_CIR may discard the input target data TGT_DTA received from the controller 120. In this case, the target data TGT_DTA may be stored only in the first memory MEM_1 and not in the second memory MEM_2.

The memory controller 120 of the memory system 100 may program the target data TGT_DTA stored in the first memory MEM_1 into the memory device 110.

As described above, in recognition that the target data TGT_DTA may not be properly programmed into the memory device 110 i.e., programming of TGT_DTA may fail, the memory system 100 may store the target data TGT_DTA in the first memory MEM_1 operating at high speed or in the second memory MEM_2 operating at low speed while programming the target data TGT_DTA.

If the data write operation received from the host is to be processed quickly, the memory system 100 may maintain the target data TGT_DTA in the high-speed first memory MEM_1 while programming the target data TGT_DTA so as to increase the overall program speed. On the other hand, if the data write operation received from the host can be processed slowly, the memory system 100 may maintain the target data TGT_DTA in the low-speed second memory MEM_2 while programming the target data TGT_DTA so as to reduce the cost required to store the target data TGT_DTA. Therefore, the memory system 100 can optimize the cost required to satisfy the data write performance required by the host.

Hereinafter, the structure and operation of the buffer circuit BUF_CIR according to an embodiment of the present disclosure is described in detail.

Figure 7:
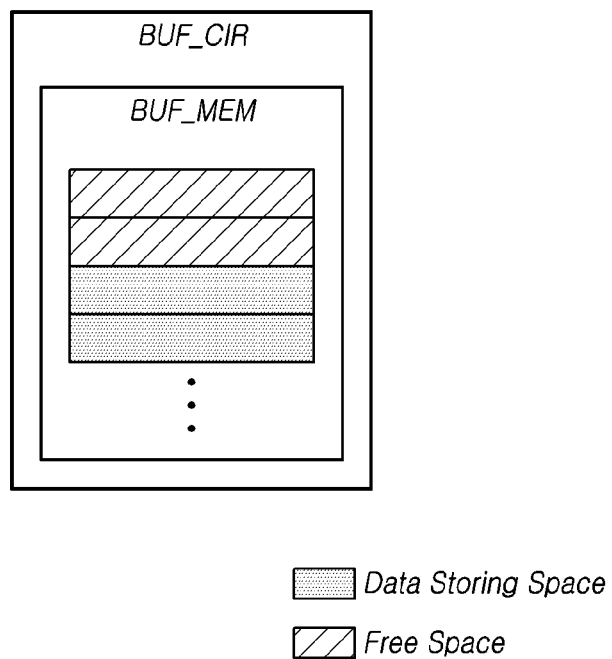
FIG. 7 is a diagram illustrating a structure of a buffer circuit according to an embodiment of the present disclosure.

FIG. 7 is a diagram illustrating the structure of a buffer circuit BUF_CIR according to an embodiment of the present disclosure.

Referring to FIG. 7, the buffer circuit BUF_CIR may include a buffer memory BUF_MEM temporarily storing data to be input to the second memory MEM_2. In this case, the buffer memory may be formed of the same type of memory (e.g., SRAM) as the first memory MEM_1 in order to quickly store input data.

The buffer circuit BUF_CIR may calculate the size of space in which data is already stored in the buffer memory BUF_MEM and the size of free space in which new data can be stored in the buffer memory BUF_MEM, and may determine an operation accordingly.

In an embodiment of the present disclosure, the buffer circuit BUF_CIR may discard the target data TGT_DTA received from the controller 120 or store the received target data TGT_DTA in the second memory MEM_2 according to the size of the input target data TGT_DTA and the size of the free space of the buffer memory. The buffer circuit BUF_CIR may further include a control circuit configured to calculate the free space of the buffer memory BUF_MEM, compare the size of the target data TGT_DTA and the size of the free space of the buffer memory BUF_MEM and discard the target data TGT_DTA or store it in the second memory MEM_2.

Figure 8:
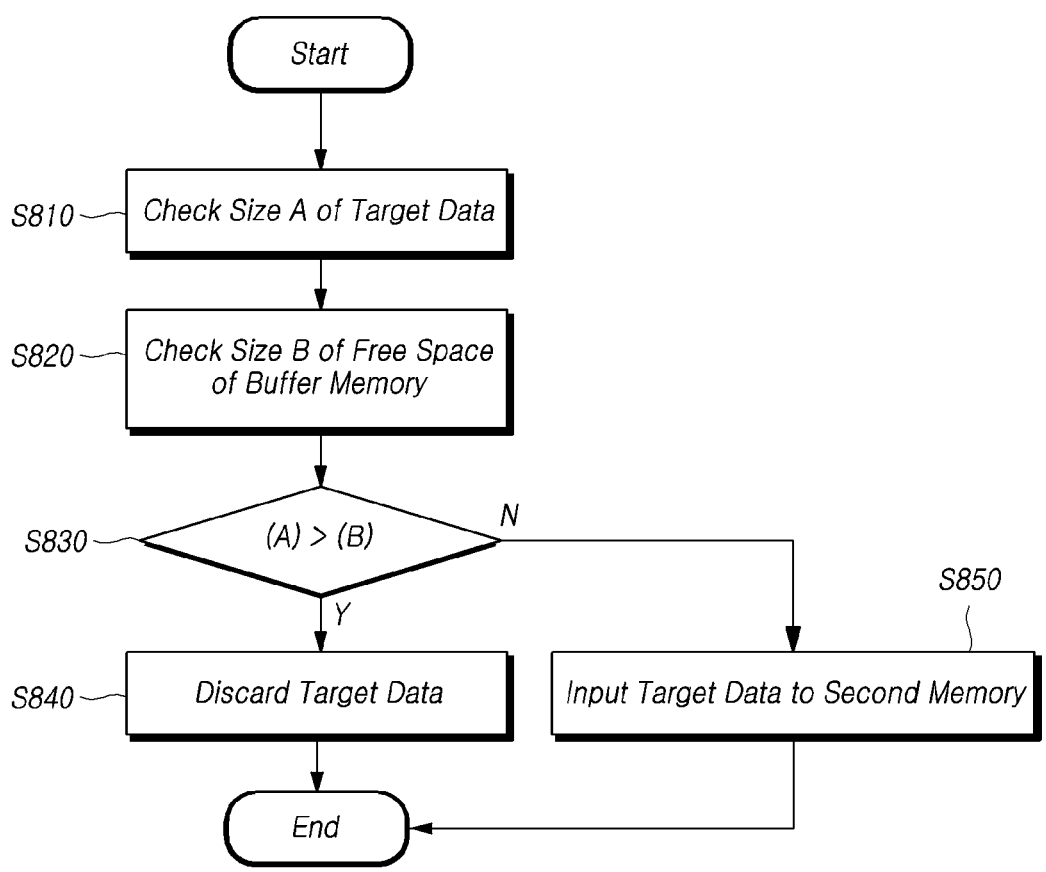
FIG. 8 is a flowchart illustrating an example of an operation of the buffer circuit according to an embodiment of the present disclosure.

FIG. 8 is a flowchart illustrating an example of an operation of the buffer circuit BUF_CIR according to an embodiment of the present disclosure. The operation illustrated in FIG. 8 may be performed by the control circuit (not illustrated) in the buffer circuit BUF_CIR.

Referring to FIG. 8, the buffer circuit BUF_CIR may check the size A of the input target data TGT_DTA (S810). The input target data TGT_DTA may be provided to the buffer circuit BUF_CIR from the controller 120.

In addition, the buffer circuit BUF_CIR may check the size B of the free space of the buffer memory BUF_MEM (S820).

The buffer circuit BUF_CIR may determine whether the value A (representing the size of the TGT_DTA) checked in operation S810 exceeds the value B (representing the free space in the BUF_CIR) checked in operation S820 (S830).

If A is greater than B (S830-Y), the buffer circuit BUF_CIR may discard the input target data TGT_DTA (S840). This is because the free space of the buffer memory is insufficient to store all the target data TGT_DTA.

On the other hand, when A is less than or equal to B (S830-N), the buffer circuit BUF_CIR may input the target data TGT_DTA into the second memory MEM_2 (S850). This is because the free space of the buffer memory is sufficient to store all the target data TGT_DTA.

In this case, the buffer circuit BUF_CIR may temporarily store the target data TGT_DTA and then store it in the second memory MEM_2. The buffer circuit BUF_CIR may store only the target data TGT_DTA alone in the second memory MEM_2, or store other data previously stored in the buffer memory BUF_MEM and the target data TGT_DTA in the second memory MEM_2 at the same time. If the buffer circuit BUF_CIR stores data in the second memory MEM_2 in a specific size data unit, and the size of the target data TGT_DTA is smaller than the data unit, the buffer circuit BUF_CIR may generate data having a data unit size by combining target data TGT_DTA with other data previously stored in the buffer memory BUF_MEM, and then store the data in the second memory MEM_2. For example, if the second memory MEM_2 stores data in units of 8 KB and the size of the target data TGT_DTA is 4 KB, the target data TGT_DTA of 4 KB and other data of 4 KB size previously stored in the buffer memory BUF_MEM may be stored together in the second memory MEM_2.

Hereinafter, the operation of discarding target data TGT_DTA by the buffer circuit BUF_CIR and the operation of inputting the target data TGT_DTA by the buffer circuit BUF_CIR into the second memory MEM_2 is described.

Figure 9:
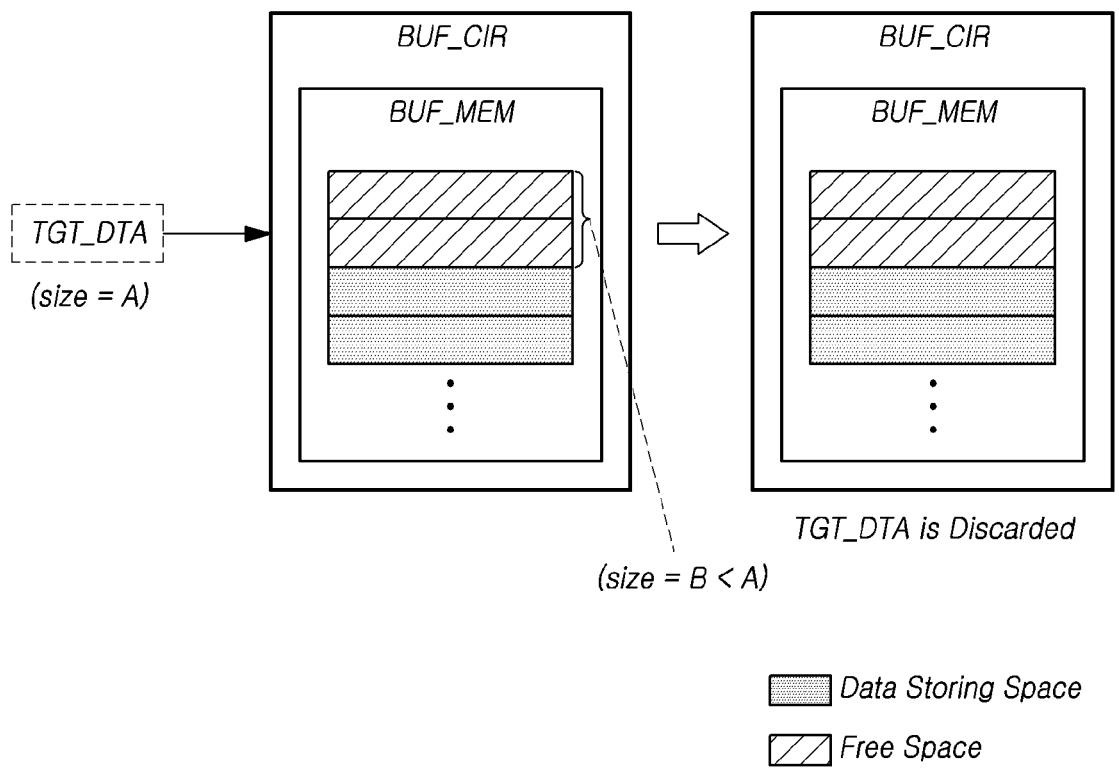
FIG. 9 is a diagram illustrating an example of an operation of discarding target data by the buffer circuit according to an embodiment of the present disclosure.

FIG. 9 is a diagram illustrating an example of an operation of discarding target data TGT_DTA by the buffer circuit BUF_CIR according to an embodiment of the present disclosure.

Referring to FIG. 9, B (size of the free space of the buffer memory BUF_MEM) is smaller than A (size of the target data TGT_DTA), the buffer circuit BUF_CIR may discard the target data TGT_DTA. In this case, the size B of the free space of the buffer memory BUF_MEM does not change.

Figure 10:
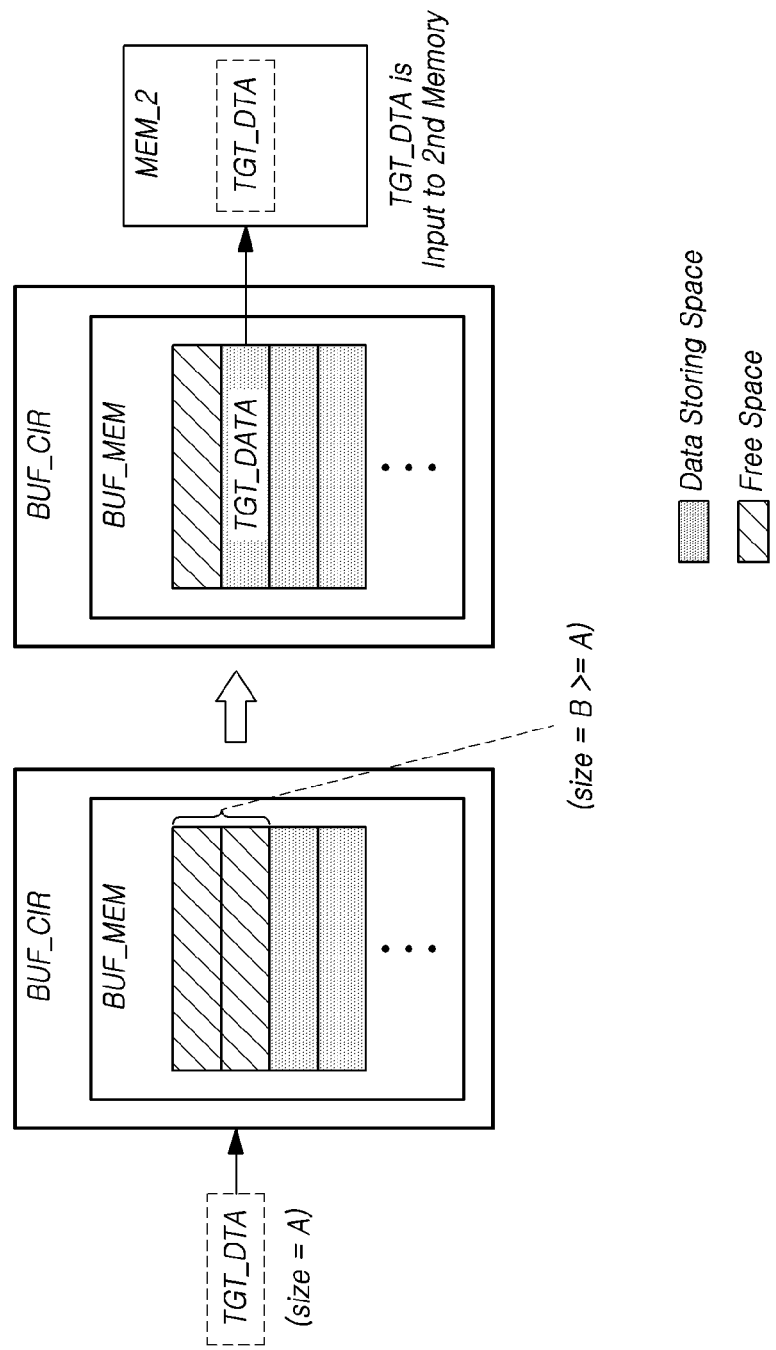
FIG. 10 is a diagram illustrating an example of an operation of inputting target data into the second memory by the buffer circuit according to an embodiment of the present disclosure.

FIG. 10 is a diagram illustrating an example of an operation of inputting target data TGT_DTA into the second memory MEM_2 by the buffer circuit BUF_CIR according to an embodiment of the present disclosure. The target data TGT_DTA may be provided from the controller 120 to the buffer circuit BUF_CIR.

Referring to FIG. 10, if the size B of the free space of the buffer memory BUF_MEM is greater than or equal to the size A of the target data TGT_DTA, the buffer circuit BUF_CIR may temporarily store the target data TGT_DTA in the buffer memory BUF_MEM. In this case, the size of the free space of the buffer memory BUF_MEM may be (B-A).

The buffer circuit BUF_CIR may then input target data TGT_DTA temporarily stored in the buffer memory BUF_MEM into the second memory MEM_2. In this case, the buffer circuit BUF_CIR may input the target data TGT_DTA to the second memory MEM_2 alone, or may input the target data TGT_DTA and other data previously stored in the buffer memory BUF_MEM into the second memory MEM_2 together. When the buffer circuit BUF_CIR inputs the target data TGT_DTA to the second memory MEM_2, the target data TGT_DTA may be stored in the second memory MEM_2.

In the above, the operation in which the buffer circuit BUF_CIR discards the target data TGT_DTA and the operation in which the buffer circuit BUF_CIR stores the target data TGT_DTA in the second memory MEM_2 have been described.

Hereinafter, the operation of the memory system 100 after the buffer circuit BUF_CIR discards the target data TGT_DTA, and the operation of the memory system 100 after the buffer circuit BUF_CIR stores the target data TGT_DTA in the second memory MEM_2 are described.

First, the operation of the memory system 100 after the buffer circuit BUF_CIR discards the target data TGT_DTA is described.

Figure 11:
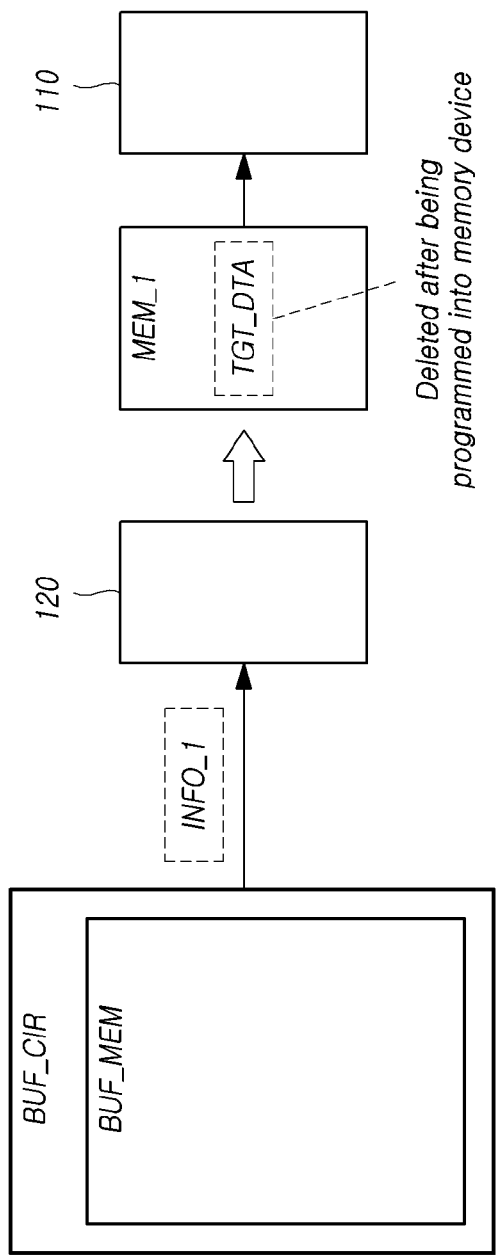
FIG. 11 is a diagram illustrating an example of an operation performed by the memory system after discarding target data according to an embodiment of the present disclosure.

FIG. 11 is a diagram illustrating an example of an operation performed by the memory system 100 after discarding target data TGT_DTA according to an embodiment of the present disclosure.

Referring to FIG. 11, if the buffer circuit BUF_CIR discards the target data TGT_DTA, the target data TGT_DTA cannot be stored in the second memory MEM_2. Accordingly, the buffer circuit BUF_CIR may notify the memory controller 120 that the operation of storing the target data TGT_DTA in the second memory MEM_2 has failed after discarding the target data TGT_DTA.

In this case, the buffer circuit BUF_CIR may output, for example, the first information INFO_1 indicating that the operation of storing the target data TGT_DTA in the second memory MEM_2 has failed. The first information INFO_1 may be outputted in the form of a message or an electrical signal configured in a specific format. An example of the structure of the first information INFO_1 is described in detail with reference to FIG. 17 below.

On the other hand, as another example, the buffer circuit BUF_CIR may not separately notify the memory controller 120 that the operation of storing the target data TGT_DTA in the second memory MEM_2 has failed. In this case, the memory controller 120 may search for the target data TGT_DTA in the first memory MEM_1 and the second memory MEM_2 to determine in which memory the target data TGT_DTA is stored.

In this case, the memory controller 120 may complete the operation of programming the target data TGT_DTA into the memory device 110 using only the target data TGT_DTA stored in the first memory MEM_1.

Accordingly, the memory controller 120 may delete the target data TGT_DTA from the first memory MEM_1 after the operation of programming the target data TGT_DTA stored in the first memory MEM_1 into the memory device 110 is successfully completed. This is because, if the memory controller 120 deletes the target data TGT_DTA from the first memory MEM_1 before the operation of programming the target data TGT_DTA to the memory device 110 is successfully completed (e.g. at the time that the operation of inputting target data TGT_DTA to the memory device 110 is completed), thereafter, if the operation of programming the target data TGT_DTA in the memory device 110 fails, the target data TGT_DTA does not exist in the first memory MEM_1 and does not exist in the second memory MEM_2, thereby it is impossible to reprogram the target data TGT_DTA into the memory device 110.

Figure 12:
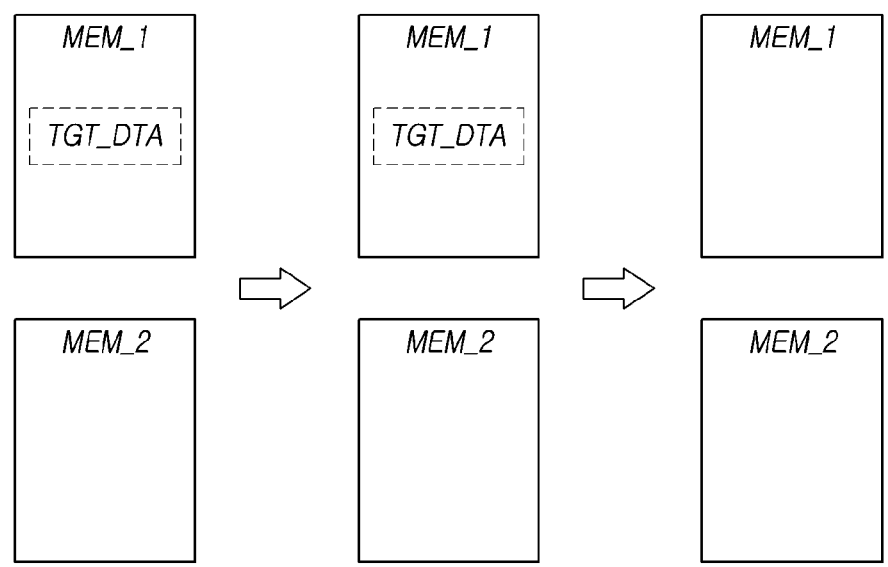
FIG. 12 is a diagram illustrating states of the first memory and the second memory shown in FIG. 11.

FIG. 12 is a diagram illustrating states of the first memory MEM_1 and the second memory MEM_2 in FIG. 11.

Referring to FIG. 12, if the buffer circuit BUF_CIR discards the target data TGT_DTA, the target data TGT_DTA may be stored in the first memory MEM_1, but the target data TGT_DTA may not be stored in the second memory MEM_2. In this case, the memory controller 120 may program the target data TGT_DTA in the memory device 110 by using the target data TGT_DTA stored in the first memory MEM_1.

The memory controller 120 may not immediately delete the target data TGT_DTA from the first memory MEM_1 after completing the operation of inputting the target data TGT_DTA into the memory device 110.

The memory controller 120 may delete the target data TGT_DTA stored in the first memory MEM_1 after the target data TGT_DTA stored in the first memory MEM_1 is successfully programmed in the memory device 110. Having successfully programmed the target data TGT_DTA in the memory device 110, it is no longer necessary to maintain such data in the memory controller 120.

Figure 13:
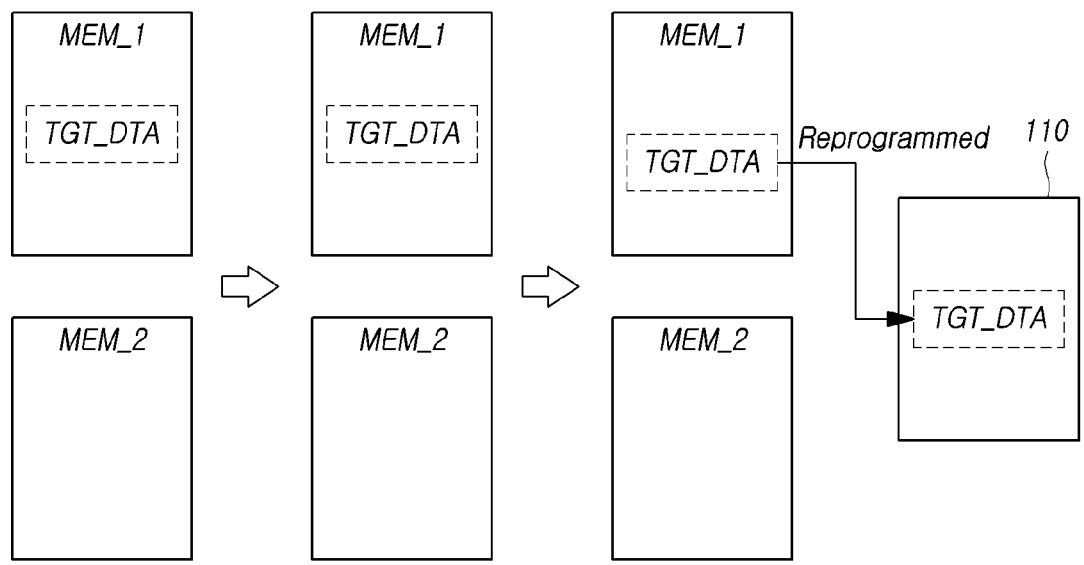
FIG. 13 is a diagram illustrating an operation of reprogramming target data by the memory system when the program fails, as indicated in FIG. 11.

FIG. 13 is a diagram illustrating an operation of reprogramming target data TGT_DTA by the memory system when the programming fails in FIG. 11.

Referring to FIG. 13, as in FIG. 12, when the buffer circuit BUF_CIR discards the target data TGT_DTA, the target data TGT_DTA may be stored in the first memory MEM_1, but the target data TGT_DTA may not be stored in the second memory MEM_2. In this case, the memory controller 120 of the memory system 100 may program the target data TGT_DTA in the memory device 110 by using the target data TGT_DTA stored in the first memory MEM_1.

The memory controller 120 may not immediately delete the target data TGT_DTA stored in the first memory MEM_1 after completing the operation of inputting the target data TGT_DTA into the memory device 110.

In the case that the operation of programming the target data TGT_DTA stored in the first memory MEM_1 into the memory device 110 has failed, the memory controller 120 may reprogram the target data TGT_DTA stored in the first memory MEM_1 into the memory device 110. Therefore, the memory controller 120 may confirm that the target data TGT_DTA is programmed in the memory device 110.

Hereinafter, the operation of the memory system 100 after the buffer circuit BUF_CIR stores the target data TGT_DTA in the second memory MEM_2 is described.

Figure 14:
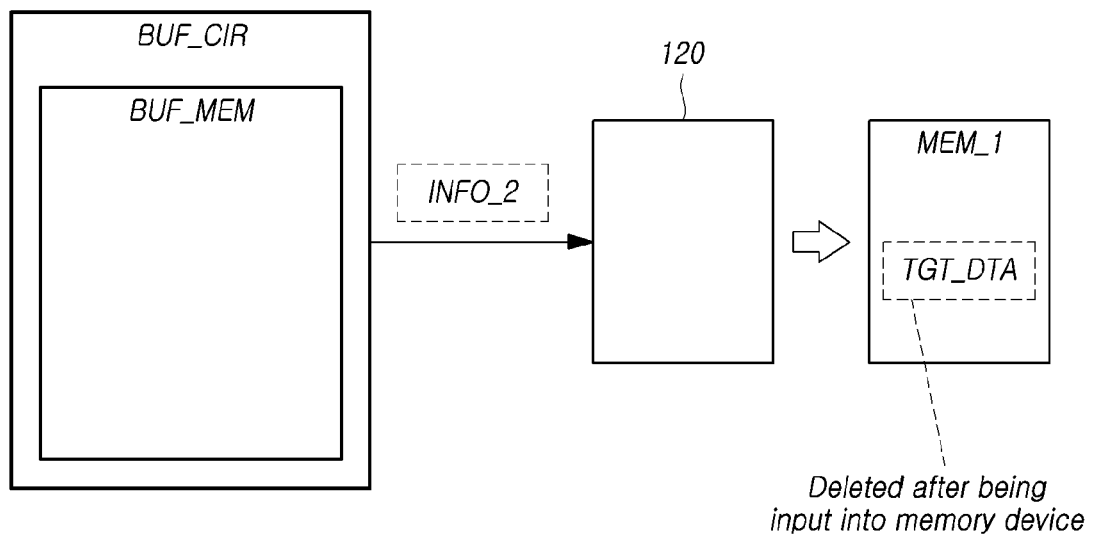
FIG. 14 is a diagram illustrating an example of an operation performed by the memory system after storing target data in the second memory according to an embodiment of the present disclosure.

FIG. 14 is a diagram illustrating an example of an operation performed by the memory system 100 after storing target data TGT_DTA in the second memory MEM_2 according to an embodiment of the present disclosure.

Referring to FIG. 14, after inputting the target data TGT_DTA into the buffer memory BUF_MEM, the buffer circuit BUF_CIR may inform the memory controller 120 that the operation of storing the target data TGT_DTA in the second memory MEM_2 has succeeded.

In this case, the buffer circuit BUF_CIR may output the second information INFO_2 indicating that the operation of storing the target data TGT_DTA in the second memory MEM_2 has succeeded. The buffer circuit BUF_CIR may input the target data TGT_DTA, that is temporarily stored in the buffer memory BUF_MEM, to the second memory MEM_2 and then transmit the second information INFO_2 to the memory controller 120. However, once the target data TGT_DTA is temporarily stored in the buffer memory BUF_MEM, the target data TGT_DTA can be stored in the second memory MEM_2, so that the buffer circuit BUF_CIR may output the second information INFO_2 even before actually storing the target data TGT_DTA in the second memory MEM_2. In this case, the second information INFO_2 may be outputted in the form of a message or an electrical signal configured in a specific format, similar to the above-described first information INFO_1. An example of the structure of the second information INFO_2 is described in detail with reference to FIG. 17 below.

As another example, the buffer circuit BUF_CIR may not separately notify the memory controller 120 that the operation of storing the target data TGT_DTA in the second memory MEM_2 has succeeded. In this case, the memory controller 120 may search for the target data TGT_DTA in the first memory MEM_1 and the second memory MEM_2 to determine in which memory the target data TGT_DTA is stored.

When the buffer circuit BUF_CIR inputs the temporarily stored target data TGT_DTA into the second memory MEM_2 and stores the target data TGT_DTA in the second memory MEM_2, the memory controller 120 may execute the operation of programming the target data TGT_DTA into the memory device 110 by using target data TGT_DTA stored in the first memory MEM_1 or the target data TGT_DTA stored in the second memory MEM_2. In this case, as described above, the memory controller 120 may first execute the operation of programming the target data TGT_DTA into the memory device 110 by using the target data TGT_DTA stored in the first memory MEM_1.

In this case, the memory controller 120 may delete the target data TGT_DTA stored in the first memory MEM_1 from the first memory MEM_1 after the operation of inputting the target data TGT_DTA to the memory device 110 is completed. After the operation of inputting the target data TGT_DTA to the memory device 110 is completed, it may take a predetermined time before the target data TGT_DTA is programmed in the memory device 110, and there may be a possibility that the operation of programming the target data TGT_DTA into the memory device 110 fails. Even if the operation of programming the target data TGT_DTA to the memory device 110 fails after the operation of inputting the target data TGT_DTA to the memory device 110 is completed, the memory controller 120 may perform the reprogramming operation by using the target data TGT_DTA stored in the second memory MEM_2.

Therefore, the memory controller 120 need not store the target data TGT_DTA in the first memory MEM_1 from the completion of the operation of inputting the target data TGT_DTA to the memory device 110 to the completion of the operation of programming the target data TGT_DTA to the memory device 110. Accordingly, since the high-speed first memory MEM_1 need not have a large storage capacity to store the target data TGT_DTA, the cost of providing the first memory MEM_1 can be reduced.

Figure 15:
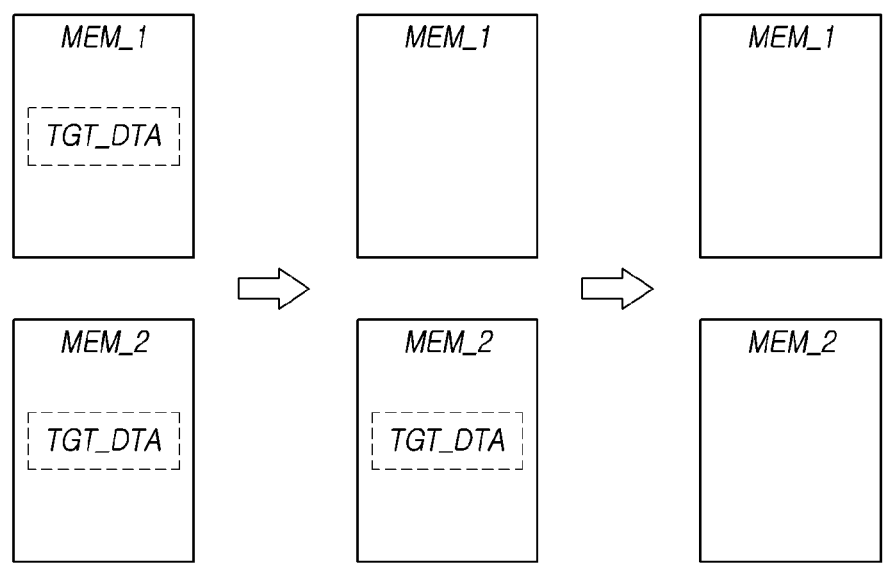
FIG. 15 is a diagram illustrating states of the first memory and the second memory shown in FIG. 14.

FIG. 15 is a diagram illustrating states of the first memory MEM_1 and the second memory MEM_2 in FIG. 14.

Referring to FIG. 15, when the buffer circuit BUF_CIR inputs the temporarily stored target data TGT_DTA into the second memory MEM_2, the target data TGT_DTA is simultaneously stored in the first memory MEM_1 and the second memory MEM_2. In this case, while the target data TGT_DTA is stored in the second memory MEM_2, the memory controller 120 may program the target data TGT_DTA into the memory device 110 by using the target data TGT_DTA stored in the first memory MEM_1.

The memory controller 120 may delete the target data TGT_DTA from the first memory MEM_1 after the target data TGT_DTA is input to the memory device 110. This is because, even if the program operation fails after the target data TGT_DTA stored in the first memory MEM_1 is deleted, it is possible to ensure that the target data TGT_DTA is programmed in the memory device 110 by using the target data TGT_DTA stored in the second memory MEM_2.

The memory controller 120 may delete the target data TGT_DTA stored in the second memory MEM_2 after the operation of programming the target data TGT_DTA in the memory device 110 is successfully completed. This is because the target data TGT_DTA is successfully programmed in the memory device 110 and thus it is not required to maintain the target data TGT_DTA in the memory controller 120.

Figure 16:
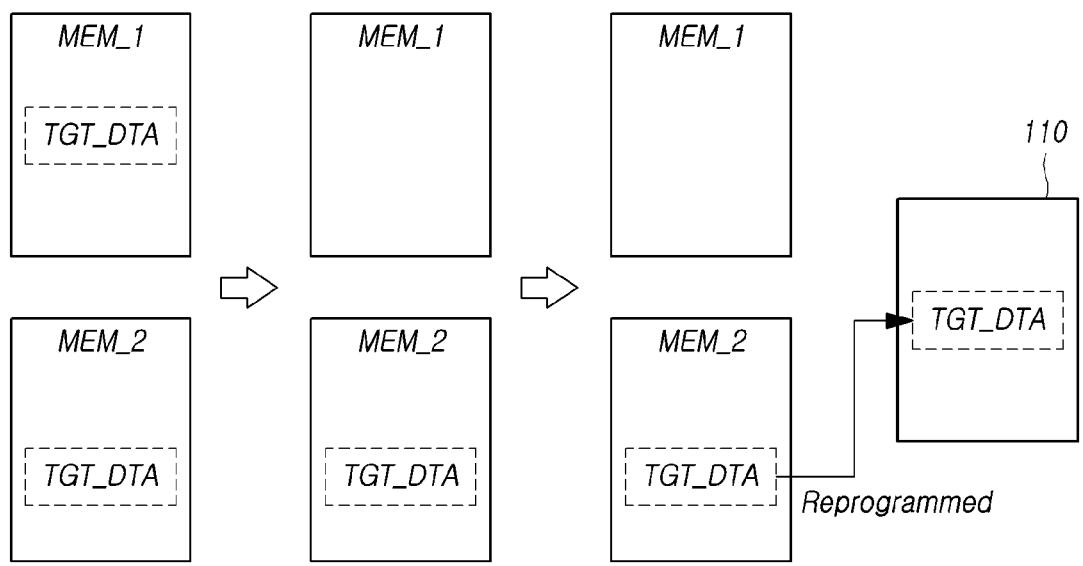
FIG. 16 is a diagram illustrating an operation of reprogramming target data when the programming fails, as indicated in FIG. 14.

FIG. 16 is a diagram illustrating an operation of reprogramming target data when the programming fails in FIG. 14.

Referring to FIG. 16, similar to FIG. 15, when the buffer circuit BUF_CIR inputs the temporarily stored target data TGT_DTA into the second memory MEM_2, the target data TGT_DTA is simultaneously stored in the first memory MEM_1 and the second memory MEM_2. In this case, the memory controller 120 may first program the target data TGT_DTA in the memory device 110 by using the target data TGT_DTA stored in the first memory MEM_1.

The memory controller 120 may delete the target data TGT_DTA stored in the first memory MEM_1 after completing the operation of inputting the target data TGT_DTA stored in the first memory MEM_1 into the memory device 110.

In the case that the operation of programming the target data TGT_DTA stored in the first memory MEM_1 into the memory device 110 fails, the memory controller 120 may reprogram the target data TGT_DTA stored in the second memory MEM_2 into the memory device 110.

Figure 17:
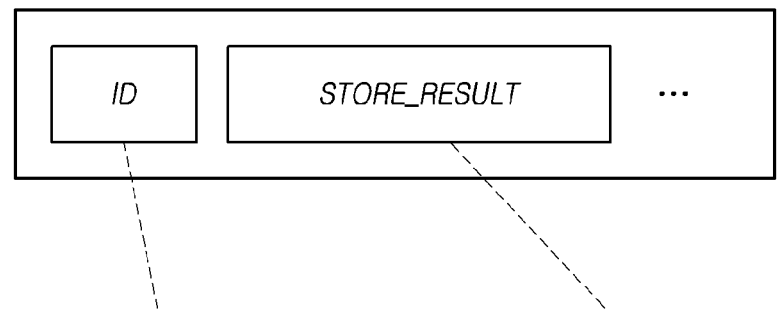
FIG. 17 is a diagram illustrating an example of a format of first information and second information according to an embodiment of the present disclosure.

FIG. 17 is a diagram illustrating an example of a format of first information INFO_1 and second information INFO_2 according to an embodiment of the present disclosure.

Referring to FIG. 17, the first information INFO_1 in FIG. 11 and the second information INFO_2 in FIG. 14 may include identifier information ID which is information for identifying target data TGT_DTA.

In addition, the first information INFO_1 and the second information INFO_2 may further include storage result information STORE_RESULT, which is information indicating whether target data TGT_DTA has been stored in the second memory MEM_2.

The identifier information ID may be determined as follows.

As an example, the identifier information ID may be a physical address for target data TGT_DTA.

As another example, the identifier information ID may be a logical address for target data TGT_DTA.

As another example, the identifier information ID may be an arbitrary value generated by the memory controller 120 to distinguish data programmed in the memory device 110. When inputting the target data TGT_DTA to the buffer circuit BUF_CIR, the memory controller 120 may input a value to be used as the identifier information ID together with the target data TGT_DTA.

The storage result information STORE_RESULT of the first information INFO_1 may indicate that the storage of the target data TGT_DTA into the second memory MEM_2 has failed, and the storage result information STORE_RESULT of the second information INFO_2 may indicate that the storage of the target data TGT_DTA into the second memory MEM_2 has succeeded.

Figure 18:
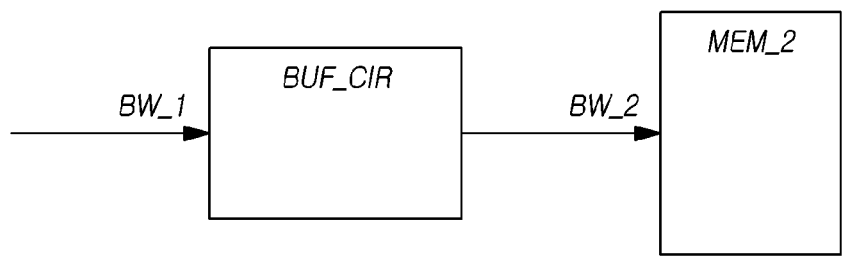
FIG. 18 is a diagram illustrating an example of a difference between a first bandwidth and a second bandwidth according to an embodiment of the present disclosure.

FIG. 18 is a diagram illustrating an example of a difference between a first bandwidth BW_1 and a second bandwidth BW_2 according to an embodiment of the present disclosure.

Referring to FIG. 18, the first bandwidth BW_1, which is for inputting data to the buffer circuit BUF_CIR, may be equal to or greater than the second bandwidth BW_2, which is for inputting data from the buffer circuit BUF_CIR to the second memory MEM_2.

In this case, the buffer circuit BUF_CIR may discard an amount of data corresponding to the difference between the first bandwidth BW_1 and the second bandwidth BW_2 of all data provided to the buffer circuit BUF_CIR from the controller 120. In this case, the data discarded by the buffer circuit BUF_CIR may not be stored in the second memory MEM_2, but may be instead stored only in the first memory MEM_1.

For example, assuming that the first bandwidth BW_1 is 32 MB per unit time (e.g., 2 ms) and the second bandwidth BW_2 is 24 MB per unit time (e.g., 2 ms), The buffer circuit BUF_CIR may discard up to 8 MB of all of the data provided during the unit time. This is because only 24 MB of data among 32 MB of data can be input to the second memory MEM_2 per unit time (e.g., 2 ms), and the remaining 8 MB of data cannot be input to the second memory MEM_2 per unit time (e.g., 2 ms).

Figure 19:
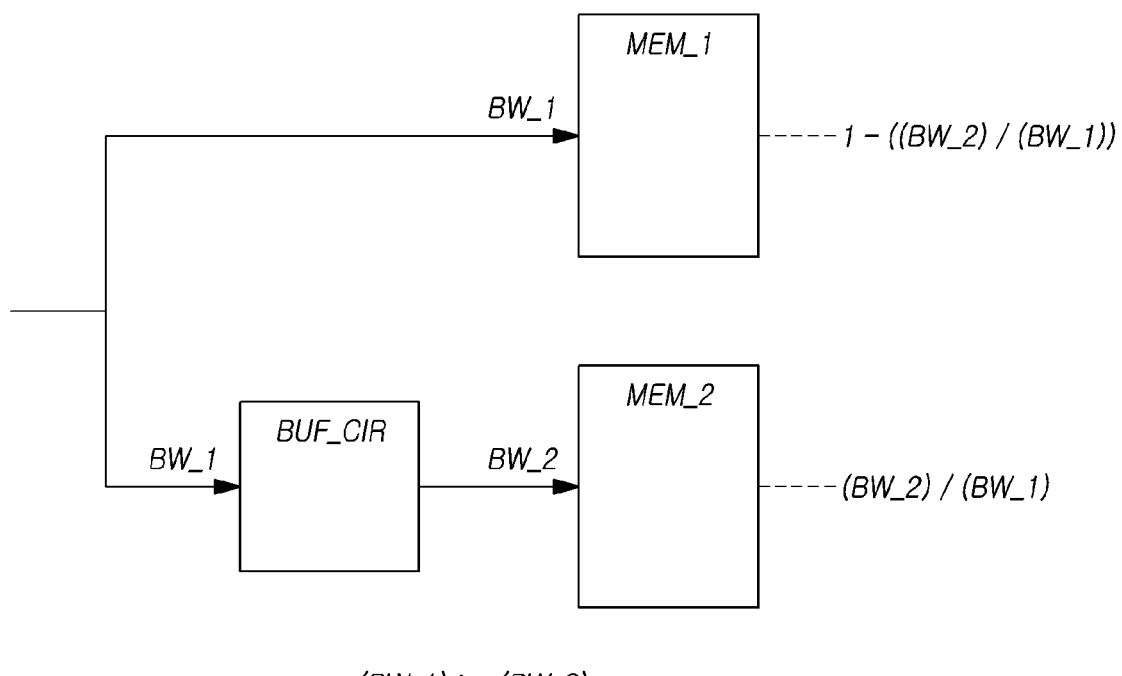
FIG. 19 is a diagram illustrating a probability that the first memory or the second memory is used for the reprogramming operation according to the difference between the first bandwidth and the second bandwidth described in FIG. 18.

FIG. 19 is a diagram illustrating a probability that the first memory MEM_1 or the second memory MEM_2 is used for the reprogramming operation according to the difference between the first bandwidth BW_1 and the second bandwidth BW_2 described in FIG. 18.

Referring to FIG. 19, the bandwidth for inputting data to the first memory MEM_1 and the buffer circuit BUF_CIR is the first bandwidth BW_1, and the bandwidth for storing data from the buffer circuit BUF_CIR in the second memory MEM_2 is the second bandwidth BW_2, and the first bandwidth BW_1 is equal to or greater than the second bandwidth BW_2.

In this case, data corresponding to the second bandwidth BW_2 may be stored in the second memory MEM_2.

Accordingly, if the programming operation fails, the memory controller 120 may execute the reprogramming operation by using the second memory MEM_2 for data corresponding to the second bandwidth BW_2.

Data corresponding to the difference between the first bandwidth BW_1 and the second bandwidth BW_2 may not be stored in the second memory MEM_2, but may be stored only in the first memory MEM_1 instead. Accordingly, if the programming operation fails, the memory controller 120 may execute the reprogramming operation by using the first memory MEM_1 for data corresponding to the difference between the first bandwidth BW_1 and the second bandwidth BW_2.

Therefore, in the case that failure occurs during the programming operation, the probability that the first memory MEM_1 and the second memory MEM_2 are used for the reprogramming operation may be determined as follows.

Probability of using the first memory MEM_1: $1-((BW\_2)/(BW\_1))$

Probability of using the second memory MEM_2: $((BW\_2)/(BW\_1))$

For example, the first bandwidth BW_1 is 32 MB per unit time (e.g., 2 ms), and the second bandwidth BW_2 is 24 MB per unit time.

In this example, the second memory MEM_2 can store 24/32=75% of the total input data because of difference between the first bandwidth BW_1 and the second bandwidth BW_2, and thus the probability that the second memory MEM_2 will be used for the reprogramming operation is 75% when the programming operation fails because 75% of the total input data is stored in the second memory MEM_2. The probability that the first memory MEM_1 will be used for that reprogram operation is 25%.

Accordingly, the memory system 100 may reduce the storage capacity of the first memory MEM_1 to 25%, that is, ¼ of the first bandwidth BW_1, and thus, cost to provide the first memory MEM_1 and the second memory MEM_2 may be reduced.

If the first bandwidth BW_1 and the second bandwidth BW_2 are known, the ratio of the storage capacity of the first memory MEM_1 and the storage capacity of the second memory MEM_2 may be optimized.

For example, if the first bandwidth BW_1 is twice the second bandwidth BW_2, the probability of using the first memory MEM_1 for reprogramming operation is ½, the probability of using the second memory MEM_2 for reprogramming operation is ½. Accordingly, a ratio of the storage capacity of the first memory MEM_1 and the storage capacity of the second memory MEM_2 may be determined to be 1:1.

As another example, if the first bandwidth BW_1 is 1.5 times the second bandwidth BW_2, the probability of using the first memory MEM_1 for reprogramming operation is ⅓, the probability of using the second memory MEM_2 for reprogramming operation is ⅔. Accordingly, a ratio of the storage capacity of the first memory MEM_1 and the storage capacity of the second memory MEM_2 may be determined to be 1:2.

Therefore, as the difference between the first bandwidth BW_1 and the second bandwidth BW_2 increases, the amount of data discarded without being stored in the second memory MEM_2 increases, so the storage capacity of the first memory MEM_1 may be greater. On the other hand, as the difference between the first bandwidth BW_1 and the second bandwidth BW_2 decreases, most of the data can be stored in the second memory MEM_2, so the storage capacity of the first memory MEM_1 may be less than it otherwise would be.

As described above, the storage capacities of the first memory MEM_1 and the second memory MEM_2 may be appropriately determined according to the difference between the first bandwidth BW_1 and the second bandwidth BW_2. Accordingly, the memory system 100 may efficiently program data into the memory device even if the difference between the first bandwidth BW_1 and the second bandwidth BW_2 increases due to a rapid increase in host performance in the future.

Figure 20:
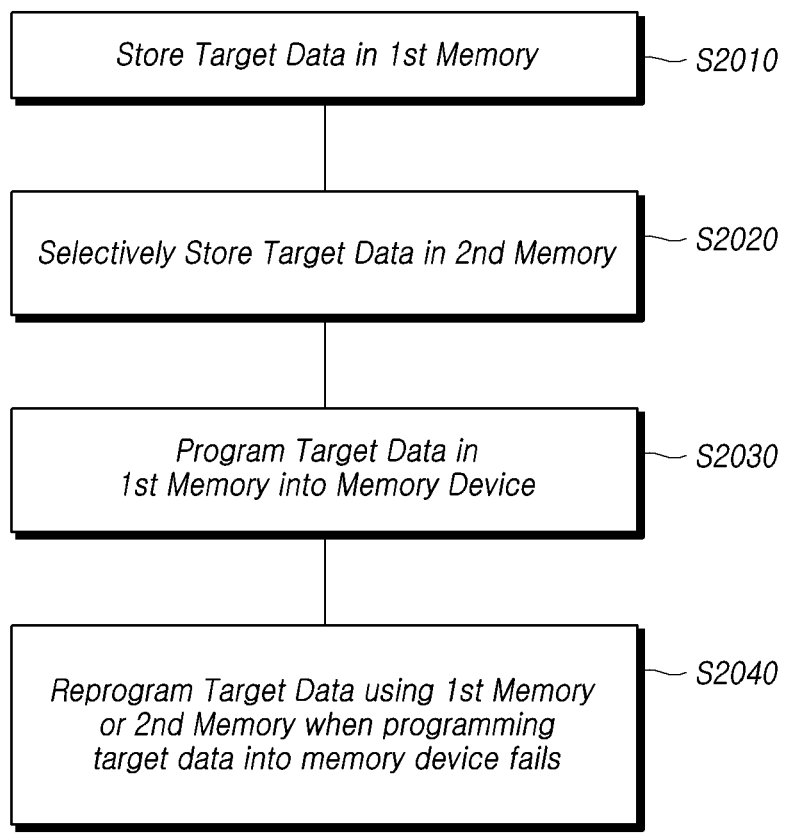
FIG. 20 is a diagram illustrating a method of operating the memory system according to an embodiment of the present disclosure.

FIG. 20 is a diagram illustrating a method of operating the memory system 100 according to an embodiment of the present disclosure.

Referring to FIG. 20, the operating method of the memory system 100 may include storing target data TGT_DTA to be programmed in the memory device 110 into the first memory MEM_1 (S2010).

In addition, the method of operating the memory system 100 may include selectively storing target data TGT_DTA in the second memory MEM_2 (S2020).

In addition, the method of operating the memory system 100 may include programming target data TGT_DTA stored in the first memory MEM_1 into the memory device 110 (S2030).

In addition, the method of operating the memory system 100 may include reprogramming by using the first memory MEM_1 or the second memory MEM_2 when the operation of programming the target data TGT_DTA stored in the first memory MEM_1 to the memory device 110 has failed. (S2040)

In this case, the first memory MEM_1 may operate at a higher speed than the second memory MEM_2.

Figure 21:
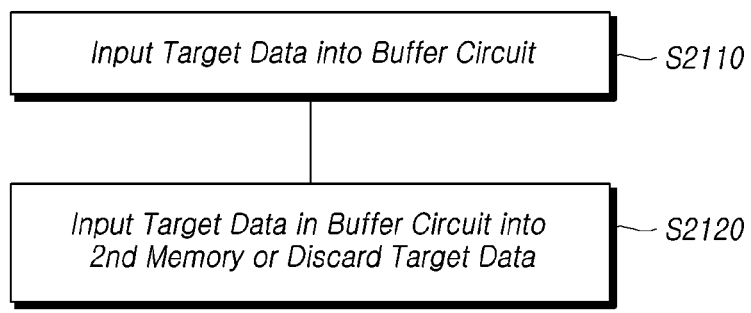
FIG. 21 is a diagram illustrating an example of selectively storing target data in the second memory according to an embodiment of the present disclosure.

FIG. 21 is a diagram illustrating an example of selectively storing target data TGT_DTA in the second memory MEM_2 according to an embodiment of the present disclosure.

Referring to FIG. 21, operation S2020 may include inputting the target data TGT_DTA to the buffer circuit BUF_CIR (S2110).

In addition, operation S2020 may include inputting the input target data TGT_DTA input to the buffer circuit BUF_CIR into the second memory MEM_2 or discarding the input target data TGT_DTA (S2120).

In operation S2120, the input target data TGT_DTA may be discarded or be input to the second memory MEM_2 according to the size of the target data TGT_DTA and the size of the free space of the buffer memory BUF_MEM in the buffer circuit BUF_CIR.

As an example, in the case that the size of the target data TGT_DTA exceeds the size of the free space of the buffer memory BUF_MEM, the input target data TGT_DTA may be discarded in the buffer circuit BUF_CIR. On the other hand, if the size of the target data TGT_DTA is less than the size of the free space of the buffer memory BUF_MEM, the input target data TGT_DTA may be temporarily stored in the buffer memory BUF_MEM and then the temporarily stored target data TGT_DTA may be input to the second memory MEM_2.

In this case, when the input target data TGT_DTA is discarded in the buffer circuit BUF_CIR, the target data TGT_DTA stored in the first memory MEM_1 may be deleted from the first memory MEM_1 after completing the operation of programming the target data TGT_DTA into the memory device 110. In this case, the operation method of the memory system 100 may further include reprogramming the target data TGT_DTA stored in the first memory MEM_1 into the memory device 110 when the operation of programming the target data TGT_DTA into the memory device 110 has failed.

On the other hand, when inputting the temporarily stored target data TGT_DTA to the second memory MEM_2, the target data TGT_DTA stored in the first memory MEM_1 may be deleted from the first memory MEM_1 after completing the operation of inputting the target data TGT_DTA stored in the first memory MEM_1 into the memory device 110 while the target data TGT_DTA is stored in the second memory MEM_2. In this case, the operation method of the memory system 100 may further include reprogramming the target data TGT_DTA stored in the second memory MEM_2 into the memory device 110 when the operation of programming the target data TGT_DTA into the memory device 110 has failed.

The operation of the memory controller 120 described above may be controlled by the control circuit 123, and may be performed in such a manner that the processor 124 executes or drives the firmware in which all operations of the memory controller 120 are programmed.

Figure 22:
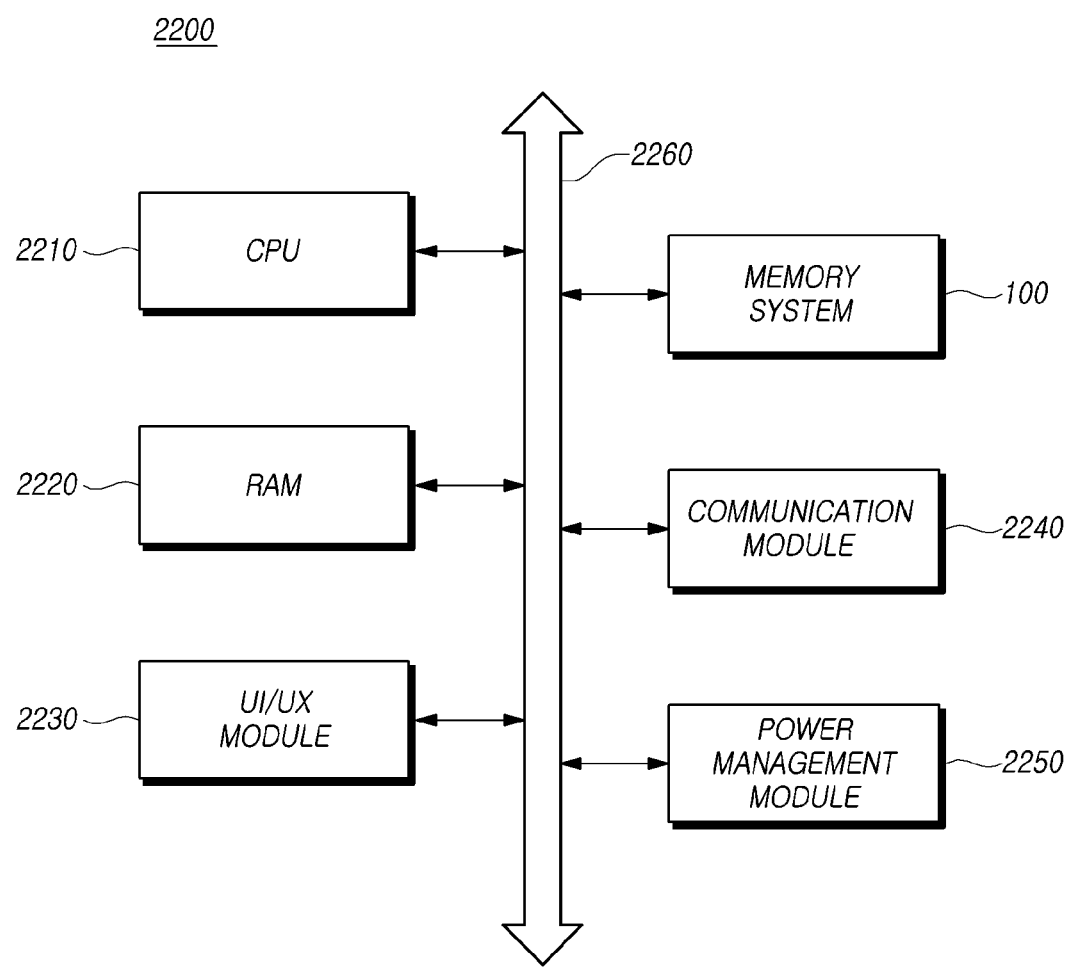
FIG. 22 is a diagram illustrating the configuration of a computing system according to an embodiment of the present disclosure.

FIG. 22 is a diagram illustrating the configuration of a computing system 2200 according to an embodiment of the present disclosure.

Referring to FIG. 22, the computing system 2200 according to an embodiment of the present disclosure may include: a memory system 100 electrically connected to a system bus 2260; a CPU 2210 configured to control the overall operation of the computing system 2200; a RAM 2220 configured to store data and information related to operations of the computing system 2200; a user interface/user experience (UI/UX) module 2230 configured to provide the user with a user environment; a communication module 2240 configured to communicate with an external device as a wired and/or wireless type; and a power management module 2250 configured to manage power used by the computing system 2200.

The computing system 2200 may be a personal computer (PC) or may include a mobile terminal such as a smartphone, a tablet or various electronic devices.

The computing system 2200 may further include a battery for supplying an operating voltage, and may further include an application chipset, a graphic-related module, a camera image processor, and a DRAM. Other elements would be obvious to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

According to embodiments of the present disclosure described above, the operation delay time of the memory system may be minimized. In addition, according to an embodiment of the present disclosure, overhead occurring in the process of calling a specific function may be minimized.

Although various embodiments of the present disclosure have been illustrated and described, those skilled in the art will appreciate that various modifications, additions and substitutions are possible, without departing from the scope and spirit of the invention as defined in the accompanying claims. The invention embraces all such variations to the extent they fall within the scope of the claims including their equivalents.

What is claimed is:

1. A memory system comprising:
   a memory device; and
   a memory controller for communicating with the memory device and controlling the memory device,
   wherein the memory controller comprises a first memory, a second memory and a buffer circuit, and
   wherein the memory controller:
   stores target data, which is data to be programmed in the memory device, in the first memory,
   selectively stores the target data in the second memory,
   programs the target data stored in the first memory into the memory device, and
   reprograms the target data stored in the first memory or the second memory into the memory device when the programming of the target data stored in the first memory into the memory device fails, and
   wherein the memory controller selectively stores the target data in the second memory by providing the target data to the buffer circuit for the buffer circuit to input the target data into the second memory or discard the target data.

2. The memory system of claim 1, wherein the first memory operates at a higher speed than the second memory.

3. The memory system of claim 1,
   wherein the buffer circuit includes a buffer memory for temporarily storing the target data, and
   wherein the buffer circuit discards the target data or inputs the target data to the second memory according to a size of the target data and a size of a free space of the buffer memory.

4. The memory system of claim 3,
   wherein the buffer circuit discards the target data when the size of the target data is larger than the size of the free space of the buffer memory, and
   wherein the buffer circuit temporarily stores the target data in the buffer memory and then inputs the temporarily stored target data to the second memory when the size of the target data is equal to or smaller than the size of the free space of the buffer memory.

5. The memory system of claim 4, wherein, when the buffer circuit discards the target data, the memory controller deletes the target data from the first memory after the programming of the target data into the memory device is completed.

6. The memory system of claim 5, wherein, when the operation of programming the target data into the memory device fails, the memory controller reprograms the target data stored in the first memory into the memory device.

7. The memory system of claim 4, wherein, when the target data is stored in the second memory, the memory controller deletes the target data from the first memory after inputting the target data from the first memory to the memory device.

8. The memory system of claim 7, wherein, when the operation of programming the target data into the memory device fails, the memory controller reprograms the target data stored in the second memory into the memory device.

9. The memory system of claim 4,
   wherein, when discarding the target data, the buffer circuit outputs first information indicating that the target data is discarded, and
   wherein, when inputting the temporarily stored target data to the second memory, the buffer circuit outputs second information indicating that the target data is stored in the second memory.

10. The memory system of claim 9, wherein the first information and the second information include identifier information for identifying the target data in the first memory.

11. The memory system of claim 10, wherein the identifier information is a logical address or a physical address for the target data.

12. The memory system of claim 1, wherein a first bandwidth, which is for inputting data to the buffer circuit, is equal to or greater than a second bandwidth, which is for inputting data from the buffer circuit to the second memory.

13. An operating method of a memory system comprising:
    storing target data, to be programmed in a memory device, in a first memory;
    selectively storing the target data in a second memory;
    programming the target data stored in the first memory into the memory device; and
    reprogramming the target data stored in the first memory or the second memory into the memory device when the programming of the target data stored in the first memory into the memory device fails,
    wherein the selectively storing of the target data in the second memory comprises:
    inputting the target data to a buffer circuit, and
    inputting the target data in the buffer circuit to the second memory or discarding the target data.

14. The operating method of claim 13, wherein the first memory operates at a higher speed than the second memory.

15. The operating method of claim 13, wherein the target data is discarded or input to the second memory according to a size of the target data and a size of a free space of a buffer memory which is included in the buffer circuit and which temporarily stores the target data.

16. The operating method of claim 15,
    wherein the target data is discarded from the buffer circuit when the size of the target data is larger than the size of the free space of the buffer memory, and
    wherein the target data is temporarily stored in the buffer memory and then input to the second memory when the size of the target data is equal to or smaller than the size of the free space of the buffer memory.

17. The operating method of claim 16, further comprising, when the target data is discarded from the buffer circuit, deleting the target data from the first memory after programming of the target data into the memory device is completed.

18. The operating method of claim 17, wherein the target data stored in the first memory is reprogrammed into the memory device.

19. The operating method of claim 16, further comprising, when the target data is stored in the second memory, deleting the target data from the first memory after inputting the target data from the first memory to the memory device.

20. The operating method of claim 19, the target data stored in the second memory is reprogrammed into the memory device.

* * * * *